(12) United States Patent
Giessmann et al.

(10) Patent No.: US 12,092,658 B2
(45) Date of Patent: Sep. 17, 2024

(54) OPTICAL DETECTION SYSTEM AND ALIGNMENT METHOD FOR A PREDETERMINED TARGET OBJECT

(71) Applicant: MPI CORPORATION, Hsinchu County (TW)

(72) Inventors: Sebastian Giessmann, Hsinchu County (TW); Po-Yi Ting, Hsinchu County (TW)

(73) Assignee: MPI CORPORATION, Hsinchu County (TW)

( * ) Notice: Subject to any disclaimer, the term of this patent is extended or adjusted under 35 U.S.C. 154(b) by 276 days.

(21) Appl. No.: 17/871,978

(22) Filed: Jul. 24, 2022

(65) Prior Publication Data
US 2023/0058964 A1    Feb. 23, 2023

Related U.S. Application Data

(60) Provisional application No. 63/234,677, filed on Aug. 18, 2021.

(51) Int. Cl.

| | |
|---|---|
| *G01B 11/30* | (2006.01) |
| *G01B 11/26* | (2006.01) |
| *G01R 1/067* | (2006.01) |
| *G01R 1/18* | (2006.01) |
| *G01R 31/28* | (2006.01) |
| *G06T 7/33* | (2017.01) |
| *G06T 11/00* | (2006.01) |
| *H04N 5/272* | (2006.01) |

(52) U.S. Cl.
CPC .......... *G01R 1/06772* (2013.01); *G01B 11/26* (2013.01); *G01R 1/18* (2013.01); *G01R 31/2891* (2013.01); *G06T 7/33* (2017.01); *G06T 11/00* (2013.01); *H04N 5/272* (2013.01); *G06T 2210/62* (2013.01)

(58) Field of Classification Search
CPC .. G01R 1/06772; G01R 1/18; G01R 31/2891; G01R 1/07; G01R 31/2635; G01R 31/308; G01R 31/2656; G01B 11/26; G06T 7/33; G06T 11/00; G06T 2210/62; G06T 2207/30148; H04N 5/272; G02B 6/4221

See application file for complete search history.

(56) References Cited

U.S. PATENT DOCUMENTS

2004/0032581 A1* 2/2004 Nikoonahad ...... G01N 21/9501
356/237.2

\* cited by examiner

*Primary Examiner* — Mesfin T Asfaw
(74) *Attorney, Agent, or Firm* — Li & Cai Intellectual Property Office

(57) ABSTRACT

An optical detection system and an alignment method for a predetermined target object are provided. The optical detection system includes a chuck stage, an optical detection module, a vision inspection module and a control module. The chuck stage includes a chuck configured for carrying a plurality of predetermined objects to be tested. The optical detection module includes an optical probe device, and the optical probe device is configured to be disposed above the chuck for optically detecting the predetermined object. The vision inspection module includes an image capturing device and an image display device. The image capturing device is configured for capturing a real-time image of the predetermined object in real time, and the image display device is configured for displaying the real-time image of the predetermined object in real time. The control module is configured to execute the alignment method for the predetermined target object.

10 Claims, 17 Drawing Sheets

OPTICAL DETECTION SYSTEM AND ALIGNMENT METHOD FOR A PREDETERMINED TARGET OBJECT

CROSS-REFERENCE TO RELATED PATENT APPLICATION

This application claims the benefit of priority to the U.S. Provisional Patent Application Ser. No. 63/234,677 filed on Aug. 18, 2021, which application is incorporated herein by reference in its entirety.

Some references, which may include patents, patent applications and various publications, can be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a probe system and an alignment method, and more particularly to an optical detection system and an alignment method for a predetermined target object.

BACKGROUND OF THE DISCLOSURE

In the related art, an optical probe device can be utilized to optically detect the function or performance of an optical element (such as an LED or a micro LED).

Optical probe devices may be utilized to probe, to optically probe, to test, and/or to optically test the functionality, operation, and/or performance of an optical element (hereinafter called the "optical detection"). When the optical probe device is used to perform the optical detection for the optical element (i.e., a target object to be tested), a fiber end portion (such as a fiber tip portion) of an optical fiber provided by the optical probe device must be moved to a position above the optical element, so as to the fiber end portion of the optical fiber provided by the optical probe device can be aligned with the optical element. This may include directing one or more optical test signals incident upon the optical element and/or receiving one or more optical resultant signals from the optical element. More specifically, one or more optical test signals provided by the optical probe device can be projected from the fiber end portion of the optical fiber to the optical element, or the fiber end portion of the optical fiber provided by the optical probe device can be used to receive one or more composite optical signals generated from the optical element, so as to optically detect the function or performance of the optical element.

In the actual operation of optical detection, it is also necessary to use an image capturing device provided by semiconductor detection equipment to obtain a real-time image of the optical element on the semiconductor detection equipment, and a real-time image of the optical probe device in advance. It is also needed to use an image display device provided by the semiconductor detection equipment to display the real-time images of both the optical element and the optical probe device.

In addition, in order to meet the requirement that multiple optical elements can be detected simultaneously, the optical probe device can be provided with an optical fiber array (i.e., a multi-channel fiber array) including a plurality of optical fibers (i.e., optical fiber cores) and an outer casing. Each optical fiber has a fiber end portion surrounded by the outer casing (only an end face of the fiber end portion is exposed from the outer casing), and the optical fibers can be positioned through a plurality of V-shaped grooves of the outer casing, respectively.

For the optical probe device 20a using the optical fiber array, the circumference of the fiber end portion 2000a of each optical fiber 200a of the optical probe device 20a is surrounded by an outer casing 201a. Moreover, the fiber end portion 2000a of the optical fiber 200a is disposed to face down the optical element C (such as an LED or a micro LED), and the optical fiber array is configured to be angled with respect to a horizontal plane (for example, the optical fiber array can be inclined or exactly vertical to the horizontal plane). Hence, when the image capturing device 31a is moved above the optical element C (such as an LED or a micro LED) for capturing the real-time image of the optical element C in a vertical direction, the vertical line of sight of the fiber end portion 2000a of each optical fiber 200a is blocked by the outer casing 201a, so that the user cannot view the positional relationship between the fiber end portion 2000a of each optical fiber 200a and the optical element C through the image display device (not shown), resulting in the fiber end portion 2000a of the optical fiber 200a not being aligned with the optical element in the vertical direction.

SUMMARY OF THE DISCLOSURE

When using the optical probe device with the optical fiber array to detect the optical element (such as an LED or a micro LED), the circumference of the fiber end portion of each optical fiber of the optical probe device is surrounded by an outer casing. Moreover, the fiber end portion of the optical fiber is disposed to face down the optical element (such as an LED or a micro LED), and the optical fiber array is configured to be angled (inclined) with respect to a horizontal plane. Hence, when the image capturing device is moved above the optical element (such as an LED or a micro LED) for capturing the real-time image of the optical element in a vertical direction, the vertical line of sight of the fiber end portion of each optical fiber is blocked by the outer casing, so that the user cannot view the positional relationship between the fiber end portion of each optical fiber and the optical element through the image display device, resulting in the fiber end portion of the optical fiber not being aligned with the optical element in the vertical direction.

In order to solve the above-mentioned problems, one of the technical aspects adopted by the present disclosure is to provide an alignment method for a predetermined target object, including: firstly, providing an optical probe device, in which the optical probe device includes a plurality of optical fibers, and each of the optical fibers has a fiber end portion for receiving or outputting one or more optical signals; next, providing an actual distance parameter, in which the actual distance parameter is a plane distance on a plane between a selected one of the fiber end portions and a selected visible reference point provided by the optical probe device; afterward, capturing the predetermined target object by an image capturing device so as to display a real-time target object image of the predetermined target object on an image display device in real time; then, marking the real-time target object image of the predetermined target object on the image display device so as to obtain a target alignment reference point aligned with the real-time target object image; next, transforming the target alignment reference point that is aligned with the real-time target object image into a plane coordinate parameter; afterward, according to the actual distance parameter and the plane coordinate parameter, obtaining a virtual alignment coordinate parameter for providing a virtual alignment point, in which a distance from the target alignment reference point to the virtual alignment point is equal to a distance from the selected fiber end portion to the selected visible reference point; and then adjusting a relative distance between the optical probe device and the predetermined target object until the selected visible reference point and the virtual alignment point coincide with each other on the image display device, so that the selected fiber end portion is correctly aligned with the predetermined target object in a vertical direction.

In the alignment method for the predetermined target object provided by one of the technical aspects of the present disclosure, one of the fiber end portions (i.e., a selected fiber end portion such as a fiber tip portion) and a visible reference point (i.e., a selected visible reference point provided by the optical probe device) are preselected from the optical probe device so as to obtain "an actual distance parameter" between the selected fiber end portion and the selected visible reference point (i.e., the step of defining the optical probe device). Next, on the image display device, the real-time target object image of the predetermined target object is marked so as to obtain a target alignment reference point aligned with the real-time target object image, and obtain "a plane coordinate parameter" that is transformed from the target alignment reference point (i.e., the step of defining the predetermined target object). Then, according to the actual distance parameter and the plane coordinate parameter, a virtual alignment point (such as a virtual alignment image generated based on the virtual alignment point) corresponding to the selected visible reference point is obtained, which can be provided to the user (or operator) for reference (i.e., the step of defining the virtual alignment point). Finally, the user can adjust a relative distance between the optical probe device and the predetermined target object under the condition of simultaneously viewing the selected visible reference point and the virtual alignment point until the selected visible reference point and the virtual alignment point overlap with each other on the image display device (at this time, the selected fiber end portion is correctly aligned with the predetermined target object in a vertical direction).

Therefore, even if the fiber end portion is blocked so that the relative position relationship among the fiber end portion and the predetermined target object that are displayed on the image display device cannot be recognized, the user can still view the relative position relationship among the selected visible reference point and the virtual alignment point that are displayed on the image display device so as to align (or coincide) the selected visible reference point and the virtual alignment point with each other on the image display device, so that the selected fiber end portion can be conveniently and quickly aligned with the predetermined target object (i.e., the optical element that needs to be optically detected or tested by the optical detection) in the vertical direction.

In order to solve the above-mentioned problems, another one of the technical aspects adopted by the present disclosure is to provide an optical detection system, which includes a chuck stage, an optical detection module, a vision inspection module and a control module. The chuck stage includes a chuck configured for carrying a plurality of predetermined objects to be tested. The optical detection module includes an optical probe device, and the optical probe device is configured to be disposed above the chuck for optically detecting the predetermined object. The vision inspection module includes an image capturing device and an image display device. The image capturing device is configured for capturing a real-time image of the predetermined object in real time, and the image display device is configured for displaying the real-time image of the predetermined object in real time. The control module is electrically connected to the chuck, the optical probe device, the image capturing device and the image display device, for controlling the chuck, the optical probe device, the image capturing device and the image display device. The control module is configured to execute an alignment method for a predetermined target object. The alignment method for the predetermined target object includes: firstly, providing an optical probe device, in which the optical probe device includes a plurality of optical fibers, and each of the optical fibers has a fiber end portion for receiving or outputting one or more optical signals; next, providing an actual distance parameter, in which the actual distance parameter is a plane distance on a plane between a selected one of the fiber end portions and a selected visible reference point provided by the optical probe device; afterward, capturing the predetermined target object by an image capturing device so as to display a real-time target object image of the predetermined target object on an image display device in real time; then, marking the real-time target object image of the predetermined target object on the image display device so as to obtain a target alignment reference point aligned with the real-time target object image; next, transforming the target alignment reference point that is aligned with the real-time target object image into a plane coordinate parameter; afterward, according to the actual distance parameter and the plane coordinate parameter, obtaining a virtual alignment coordinate parameter for providing a virtual alignment point, in which a distance from the target alignment reference point to the virtual alignment point is equal to a distance from the selected fiber end portion to the selected visible reference point; and then adjusting the relative distance between the optical probe device and the predetermined target object until the selected visible reference point and the virtual alignment point coincide with each other on the image display device, so that the selected fiber end portion is correctly aligned with the predetermined target object in a vertical direction.

In the optical detection system provided by another one of the technical aspects of the present disclosure, the optical detection system can be applied to execute an alignment method for a predetermined target object. Regarding the alignment method for the predetermined target object, one of the fiber end portions (i.e., a selected fiber end portion such as a fiber tip portion) and a visible reference point (i.e., a selected visible reference point provided by the optical probe device) are preselected from the optical probe device so as to obtain "an actual distance parameter" between the selected fiber end portion and the selected visible reference point (i.e., the step of defining the optical probe device). Next, on the image display device, the real-time target object image of the predetermined target object is marked so as to obtain a target alignment reference point aligned with the real-time target object image, and obtain "a plane coordinate parameter" that is transformed from the target alignment reference point (i.e., the step of defining the predetermined target object). Then, according to the actual distance parameter and the plane coordinate parameter, a virtual alignment point (such as a virtual alignment image generated based on the virtual alignment point) corresponding to the selected visible reference point is obtained, which can be provided to the user or operator for reference (i.e., the step of defining the virtual alignment point). Finally, the user can adjust a relative distance between the optical probe device and the predetermined target object under the condition of simultaneously viewing the selected visible reference point and the virtual alignment point until the selected visible reference point and the virtual alignment point overlap with each other on the image display device (at this time, the selected fiber end portion is correctly aligned with the predetermined target object in a vertical direction).

Therefore, even if the fiber end portion is blocked so that the relative position relationship among the fiber end portion and the predetermined target object that are displayed on the image display device cannot be recognized, the user can still view the relative position relationship among the selected visible reference point and the virtual alignment point that are displayed on the image display device so as to align (or coincide) the selected visible reference point and the virtual alignment point with each other on the image display device, so that the selected fiber end portion can be conveniently and quickly aligned with the predetermined target object (i.e., the optical element that needs to be optically detected or tested by the optical detection) in the vertical direction.

In order to solve the above-mentioned problems, yet another one of the technical aspects adopted by the present disclosure is to provide an optical detection system, which includes a chuck stage, an optical detection module, a vision inspection module and a control module. The chuck stage includes a chuck configured for carrying a plurality of predetermined objects to be tested. The optical detection module includes an optical probe device disposed above the chuck for optically detecting the predetermined object. The vision inspection module includes an image capturing device disposed above the chuck, and an image display device electrically connected to the image capturing device. The image capturing device is configured for capturing a real-time image of the predetermined object in real time, and the image display device is configured for displaying the real-time image of the predetermined object in real time. The control module is electrically connected to the chuck, the optical probe device, the image capturing device and the image display device, for controlling the chuck, the optical probe device, the image capturing device and the image display device. The optical probe device includes a plurality of optical fibers and an outer casing configured for carrying the optical fibers, and each of the optical fibers has a fiber end portion for receiving or outputting one or more optical signals. The outer casing of the optical probe device has a selected visible reference point disposed thereon for corresponding to a selected one of the fiber end portions, and the selected visible reference point of the outer casing is configured to be able to be identified by the image capturing device. The selected visible reference point selected from the outer casing of the optical probe device is configured to determine a plane distance from the selected fiber end portion to one of the predetermined objects.

In the optical detection system provided by yet another one of the technical aspects of the present disclosure, the selected visible reference point is disposed on the outer casing of the optical probe device, so that the selected visible reference point can be configured to be able to be identified by the image capturing device (that is to say, the user can view the selected visible reference point by cooperation of the image capturing device and the image display device). Furthermore, the selected visible reference point provided by the outer casing of the optical probe device can correspond to the selected fiber end portion, so that the user can obtain the position of the fiber end portion relative to the selected visible reference point through the selected visible reference point, and can determine a plane distance from the selected fiber end portion to one of the predetermined objects. For example, the optical detection system provided by yet another one of the technical aspects adopted by the present disclosure can be applied to execute an alignment method for a predetermined target object. Regarding the alignment method for the predetermined target object, one of the fiber end portions (i.e., a selected fiber end portion such as a fiber tip portion) and a visible reference point (i.e., a selected visible reference point provided by the optical probe device) are preselected from the optical probe device so as to obtain "an actual distance parameter" between the selected fiber end portion and the selected visible reference point (i.e., the step of defining the optical probe device). Next, on the image display device, the real-time target object image of the predetermined target object is marked so as to obtain a target alignment reference point aligned with the real-time target object image, and obtain "a plane coordinate parameter" that is transformed from the target alignment reference point (i.e., the step of defining the predetermined target object). Then, according to the actual distance parameter and the plane coordinate parameter, a virtual alignment point (such as a virtual alignment image generated based on the virtual alignment point) corresponding to the selected visible reference point is obtained, which can be provided to the user or operator for reference (i.e., the step of defining the virtual alignment point). Finally, the user can adjust a relative distance between the optical probe device and the predetermined target object under the condition of simultaneously viewing the selected visible reference point and the virtual alignment point until the selected visible reference point and the virtual alignment point overlap with each other on the image display device (at this time, the selected fiber end portion is correctly aligned with the predetermined target object in a vertical direction).

Therefore, even if the fiber end portion is blocked so that the relative position relationship among the fiber end portion and the predetermined target object that are displayed on the image display device cannot be recognized, the user can still view the relative position relationship among the selected visible reference point and the virtual alignment point that are displayed on the image display device so as to align (or coincide) the selected visible reference point and the virtual alignment point with each other on the image display device, so that the selected fiber end portion can be conveniently and quickly aligned with the predetermined target object (i.e., the optical element that needs to be optically detected or tested by the optical detection) in the vertical direction.

In one of the possible or preferred embodiments, the optical fibers of the optical probe device are arranged in sequence to form an optical fiber array for simultaneously detecting a plurality of predetermined objects to be tested, and one of the predetermined objects is the predetermined target object. The optical probe device includes an outer casing configured for carrying the fiber end portions, and the selected visible reference point is located at one of a plurality of corners of the outer casing or one of a plurality of fixed markers of the outer casing. Among all of the fiber end portions, the selected fiber end portion is closest to the selected visible reference point, so that the plane distance from the selected fiber end portion to the selected visible reference point is a shortest plane distance between the fiber end portion and the selected visible reference point. The actual distance parameter includes an X1 value and a Y1 value, the X1 value is an interval between the selected fiber end portion and the selected visible reference point on an X-axis direction provided by the plane, and the Y1 value is an interval between the selected fiber end portion and the selected visible reference point on a Y-axis direction provided by the plane. The step of providing the actual distance parameter further includes: inputting the X1 value and the Y1 value or inputting model information of the optical probe device in a user interface, and the model information of the optical probe device contains the X1 value and the Y1 value.

In the above-mentioned possible or preferred embodiments, the selected visible reference point can be located at one of the corners of the outer casing (for example, at a 90 degree corner on the top side of the outer casing), or one of the fixed markers of the outer casing (for example, at a marker on the top side of the outer casing), so that the user can easily view the selected visible reference point through the image display device. Furthermore, among all of the fiber end portions, the selected fiber end portion is closer to the selected visible reference point than any one of the other fiber end portions (i.e., there is a shortest plane distance between the selected fiber end portion and the selected visible reference point), so that the user can quickly identify or find the relative position relationship among the selected fiber end portion and the selected visible reference point on the image display device. In addition, the X1 value and the Y1 value, or the model information including the X1 value and the Y1 value can be selectively entered into a user interface by the user, so that the present disclosure can provide the user with more input options in the step of providing the actual distance parameter.

In one of the possible or preferred embodiments, in the step of marking the real-time target object image of the predetermined target object on the image display device, the real-time target object image is marked by a movable marker that is controllable through an input device. In the step of obtaining the virtual alignment coordinate parameter, the virtual alignment coordinate parameter is obtained by calculating the actual distance parameter and the plane coordinate parameter through a control module, and the virtual alignment point is selectively displayed or not displayed on the image display device. The actual distance parameter includes an X1 value and a Y1 value on an XY coordinate system provided by the plane, the X1 value is an interval between the selected fiber end portion and the selected visible reference point in an X-axis direction of the XY coordinate system provided by the plane, and the Y1 value is an interval between the selected fiber end portion and the selected visible reference point in a Y-axis direction of the XY coordinate system provided by the plane. The plane coordinate parameter includes an X2 value and a Y2 value on an XY coordinate system provided by the image display device, the X2 value is a distance from the target alignment reference point to a Y-axis of the XY coordinate system provided by the image display device, and the Y2 value is a distance from the target alignment reference point to a Y-axis of the XY coordinate system provided by the image display device. The virtual alignment coordinate parameter includes an X3 value obtained by adding the X1 value and the X2 value, and a Y3 value obtained by adding the Y1 value and the Y2 value, the X3 value and the Y3 value are on the XY coordinate system that are provided by the image display device, the X3 value is a distance from the virtual alignment point to a Y-axis of the XY coordinate system provided by the image display device, and the Y3 value is a distance from the virtual alignment point to an X-axis of the XY coordinate system provided by the image display device.

In the above-mentioned possible or preferred embodiments, the real-time target object image can be marked by using an input device (such as an external or a touch module of the image display device) to control a movable marker (such as a cursor displayed on the image display device), so that the present disclosure can provide the user with more input options in the step of marking the real-time target object image of the predetermined target object on the image display device. Furthermore, the virtual alignment point can be displayed on the image display device (or the virtual alignment point displayed on the image display device cannot be recognized), so that the present disclosure can manually adjust a relative distance between the optical probe device (i.e., the outer casing) and the predetermined target object according to the virtual alignment point displayed on the image display device (or the present disclosure can automatically adjust a relative distance between the optical probe device (i.e., the outer casing) and the predetermined target object according to the virtual alignment point that is not displayed on the image display device) until the selected visual reference point and the virtual alignment point are aligned (or coincided) with each other on the image display device. In addition, the actual distance parameter can provide the X1 value and the Y1 value on the XY coordinate system provided by a plane (that is to say, on the XY coordinate system provided by the plane, a plane distance between the selected fiber end portion and the selected visible reference point can be presented by the X1 value and the Y1 value), and the plane coordinate parameter can provide the X2 value and the Y2 value on the XY coordinate system provided by the image display device (that is to say, on the XY coordinate system provided by the image display device, the distance of the target alignment reference point relative to the origin (0, 0) of the XY coordinate system can be presented by the X2 value and the Y2 value), so that the X3 value obtained by adding the X1 value and X2 value, and the Y3 value obtained by adding the Y1 value and the Y2 value can be presented on the XY coordinate system provided by the image display device, so that the X3 value obtained by adding the X1 value and the X2 value, and the Y3 value obtained by adding the Y1 value and the Y2 value can be presented on the XY coordinate system provided by the image display device. Therefore, the virtual alignment coordinate parameter can provide the X3 value and the Y3 value through the XY coordinate system provided by the image display device (that is to say, on the XY coordinate system provided by the image display device, the distance of the virtual alignment point relative to the origin (0, 0) of the XY coordinate system can be presented by the X3 value and the Y3 value).

In one of the possible or preferred embodiments, after the step of obtaining the virtual alignment coordinate parameter, the alignment method further incudes: according to the target alignment reference point and the virtual alignment coordinate parameter, generating a virtual alignment image that is displayed on the image display device. In the step of adjusting the relative distance between the optical probe device and the predetermined target object, the alignment method further includes: capturing an outer casing of the optical probe device by the image capturing device so as to display a real-time outer casing image of the outer casing on the image display device in real time, and manually adjusting the relative distance between the outer casing and the predetermined target object until the real-time outer casing image and the virtual alignment image that are displayed on the image display device overlap with each other, in which, at least one contour line of the real-time outer casing image corresponds to at least one contour line of the virtual alignment image. In the step of adjusting the relative distance between the optical probe device and the predetermined target object, the alignment method further includes: when the at least one contour line of the real-time outer casing image is offset from the at least one contour line of the virtual alignment image, manually rotating the outer casing of the optical probe device relative to a Z-axis of an XYZ coordinate system provided by the image display device until the at least one contour line of the real-time outer casing image and the at least one contour line of the virtual alignment image overlap with each other or are parallel to each other. The optical probe device includes an outer casing configured for carrying the fiber end portions, and both an outer contour of the virtual alignment image and an outer contour of the outer casing are completely or partially the same. The virtual alignment image displayed on the image display device is translucent so as to allow a user to view the real-time outer casing image that is displayed on the image display device. In an overlapping relationship in a Z-axis direction between the virtual alignment image, the real-time target object image and the real-time outer casing image that are displayed on the image display device, the virtual alignment image is located at an uppermost layer, the real-time target object image is located at a bottommost layer, and the real-time outer casing image is located between the virtual alignment image and the real-time target object image.

In the above-mentioned possible or preferred embodiments, the virtual alignment image can be generated on the image display device relative to the virtual alignment point, so that the user can manually adjust a relative distance between the outer casing and the predetermined target object in the X-axis direction and Y-axis direction (i.e., moving the position of the real-time outer casing image of the outer casing relative to the virtual alignment image on the image display device), or manually rotate the outer casing of the optical probe device relative to the Z-axis (i.e., rotating the angle of the real-time outer casing image of the outer casing relative to the virtual alignment image on the image display device) according to the virtual alignment image that is displayed on the image display device until the real-time outer casing image and the virtual alignment image completely overlap with each other on the image display device, so that the selected fiber end portion can be correctly aligned with the predetermined target object in a vertical direction. Furthermore, the outer contour (such as a square contour or an L-shape contour) of the virtual alignment image and the outer contour (such as a square contour or an L-shape contour) of the outer casing can be identical or partially identical, so that the present disclosure can provide the user with more customized options about the virtual alignment image. In addition, the virtual alignment image displayed on the image display device can be translucent, so that when the virtual alignment image is located on the uppermost layer in the overlapping relationship in the Z-axis direction, the real-time outer casing image is not completely blocked by the virtual alignment image, thereby the user can still view the real-time outer casing image of the outer casing through the image display device.

In one of the possible or preferred embodiments, after the step of obtaining the virtual alignment coordinate parameter, the alignment method further includes: according to the target alignment reference point and the virtual alignment coordinate parameter, generating a virtual alignment image that is not displayed on the image display device. In the step of adjusting the relative distance between the optical probe device and the predetermined target object, the alignment method further includes: capturing an outer casing of the optical probe device by the image capturing device so as to display a real-time outer casing image of the outer casing on the image display device in real time, and automatically adjusting the relative distance between the outer casing and the predetermined target object until the real-time outer casing image and the virtual alignment image overlap with each other, in which, at least one contour line of the real-time outer casing image corresponds to at least one contour line of the virtual alignment image that is not displayed on the image display device. In the step of adjusting the relative distance between the optical probe device and the predetermined target object, the alignment method further includes: when the at least one contour line of the real-time outer casing image is offset from the at least one contour line of the virtual alignment image, automatically rotating the outer casing of the optical probe device relative to a Z-axis of an XYZ coordinate system provided by the image display device until the at least one contour line of the real-time outer casing image and the at least one contour line of the virtual alignment image overlap with each other or are parallel to each other.

In the above-mentioned possible or preferred embodiments, the virtual alignment image is not generated on the image display device relative to the virtual alignment point, so that the control module of the optical detection system can automatically adjust a relative distance between the outer casing and the predetermined target object in the X-axis direction and Y-axis direction (i.e., moving the position of the real-time outer casing image of the outer casing relative to the virtual alignment image on the image display device), or automatically rotate the outer casing of the optical probe device relative to the Z-axis (i.e., rotating the angle of the real-time outer casing image of the outer casing relative to the virtual alignment image on the image display device) according to the virtual alignment image that is not displayed on the image display device until the real-time outer casing image and the virtual alignment image completely overlap with each other on the image display device, so that the selected fiber end portion can be automatically and correctly aligned with the predetermined target object in a vertical direction, which can effectively save the time that the user needs to manually adjust the optical probe device.

In one of the possible or preferred embodiments, the alignment method for the predetermined target object further includes: firstly, moving the predetermined target object or the image capturing device to obtain an actual moving distance of the predetermined target object along a predetermined direction; afterward, according to the actual moving distance of the predetermined target object along the predetermined direction, obtaining an image pixel distance of the real-time target object image of the predetermined target object displayed on the image display device moving along the predetermined direction; and then according to the image pixel distance of the real-time target object image and the actual moving distance of the predetermined target object, obtaining a conversion ratio of the image pixel distance to the actual moving distance. When the predetermined target object or the image capturing device is moved so that the predetermined target object is offset along an offset direction by an actual offset distance, a virtual alignment image displayed on the image display device is automatically shifted along the offset direction by an offset pixel distance according to the conversion ratio, so that the virtual alignment image and the real-time outer casing image that are displayed on the image display device can be maintained in a state of overlapping with each other.

In the above-mentioned possible or preferred embodiments, the conversion ratio of the image pixel distance to the actual moving distance can be obtained according to the image pixel distance of the real-time target object image and the actual moving distance of the predetermined target object. Hence, when the predetermined target object or the image capturing device is unexpectedly moved by an actual offset distance (for example, when the user accidentally touches a chunk that is used for carrying the predetermined target object, or touches the image capturing device), the virtual alignment image displayed on the image display device can be automatically shifted along the offset direction by an offset pixel distance according to the conversion ratio, thereby the virtual alignment image and the real-time outer casing image that are displayed on the image display device can be maintained in a mutually overlapping state, and it will not be affected by the user accidentally touching the predetermined target object or the image capturing device.

In one of the possible or preferred embodiments, each of the optical fibers has a fiber end portion for receiving or outputting one or more optical signals. The optical fibers of the optical probe device are arranged in sequence to form an optical fiber array for simultaneously detecting the predetermined object. The optical probe device includes an outer casing configured for carrying the fiber end portions, and a selected visible reference point provided by the optical probe device is located at one of a plurality of corners of the outer casing or one of a plurality of fixed markers of the outer casing. Among all of the fiber end portions, a selected one of the fiber end portions is closest to the selected visible reference point, so that a plane distance from the selected fiber end portion to the selected visible reference point is a shortest plane distance between the fiber end portion and the selected visible reference point.

In the above-mentioned possible or preferred embodiments, the selected visible reference point can be located at one of the corners of the outer casing (for example, at a 90 degree corner on the top side of the outer casing), or one of the fixed markers of the outer casing (for example, at a marker on the top side of the outer casing), so that the user can easily view the selected visible reference point through the image display device. Furthermore, among all of the fiber end portions, the selected fiber end portion is closer to the selected visible reference point than any one of the other fiber end portions (i.e., there is a shortest plane distance between the selected fiber end portion and the selected visible reference point), so that the user can quickly identify or find the relative position relationship among the selected fiber end portion and the selected visible reference point on the image display device.

In one of the possible or preferred embodiments, the optical fibers of the optical probe device are arranged in sequence to form an optical fiber array for simultaneously detecting a plurality of predetermined objects to be tested. The optical probe device includes an outer casing configured for carrying the fiber end portions, and the selected visible reference point is located at one of a plurality of corners of the outer casing or one of a plurality of fixed markers of the outer casing. Among all of the fiber end portions, the selected fiber end portion is closest to the selected visible reference point, so that the plane distance from the selected fiber end portion to the selected visible reference point is a shortest plane distance between the fiber end portion and the selected visible reference point.

In the above-mentioned possible or preferred embodiments, the selected visible reference point can be located at one of the corners of the outer casing (for example, at a 90 degree corner on the top side of the outer casing), or one of the fixed markers of the outer casing (for example, at a marker on the top side of the outer casing), so that the user can easily view the selected visible reference point through the image display device. Furthermore, among all of the fiber end portions, the selected fiber end portion is closer to the selected visible reference point than any one of the other fiber end portions (i.e., there is a shortest plane distance between the selected fiber end portion and the selected visible reference point), so that the user can quickly identify or find the relative position relationship among the selected fiber end portion and the selected visible reference point on the image display device.

These and other aspects of the present disclosure will become apparent from the following description of the embodiment taken in conjunction with the following drawings and their captions, although variations and modifications therein can be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
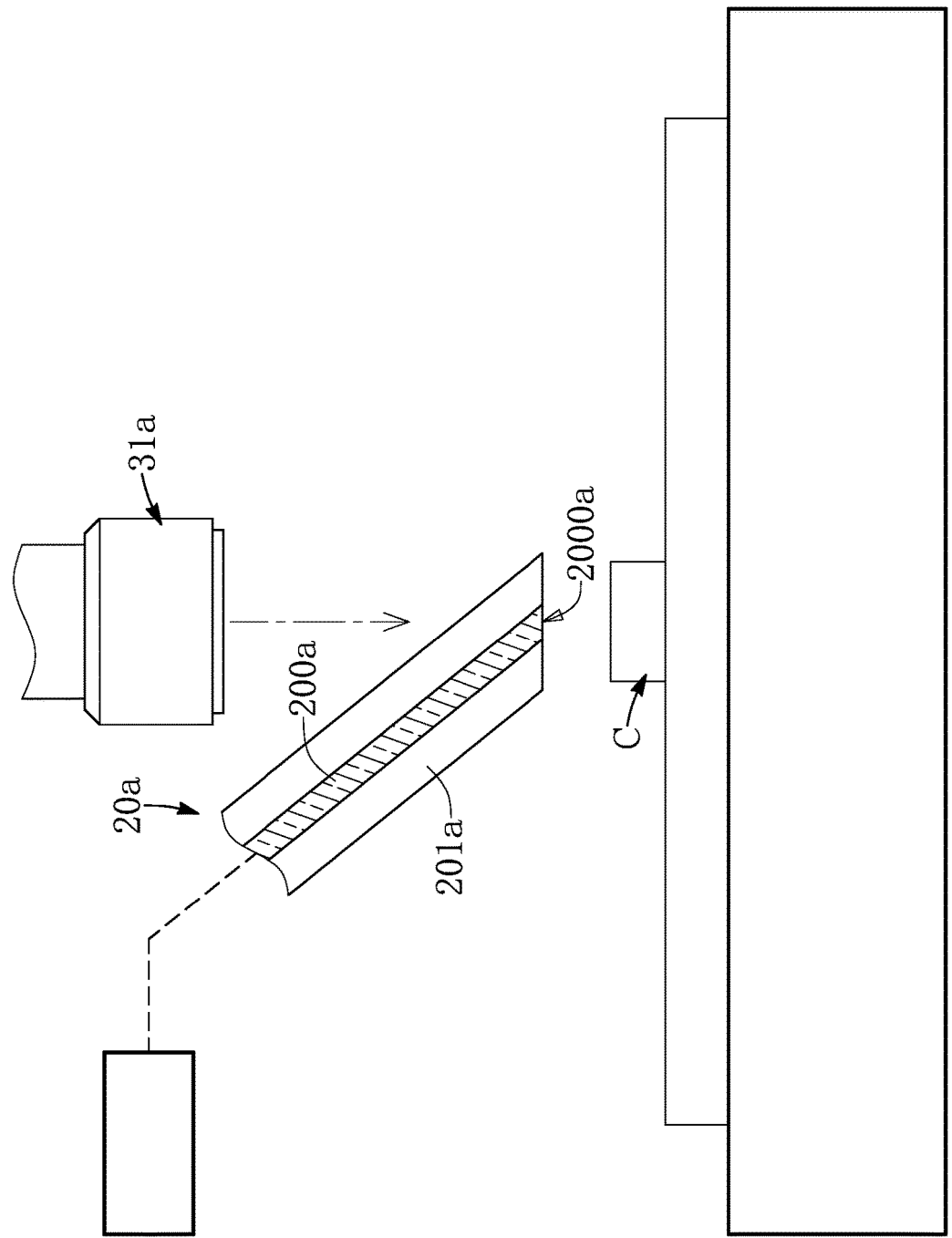
FIG. 1 is a schematic view of an optical detection system according to the related art.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an," and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 2 to FIG. 11, a first embodiment of the present disclosure provides an optical detection system S and an alignment method for a predetermined target object T through the optical detection system S, and the optical detection system S includes a chuck stage 1, an optical detection module 2, a vision inspection module 3 and a control module 4.

Figure 2:
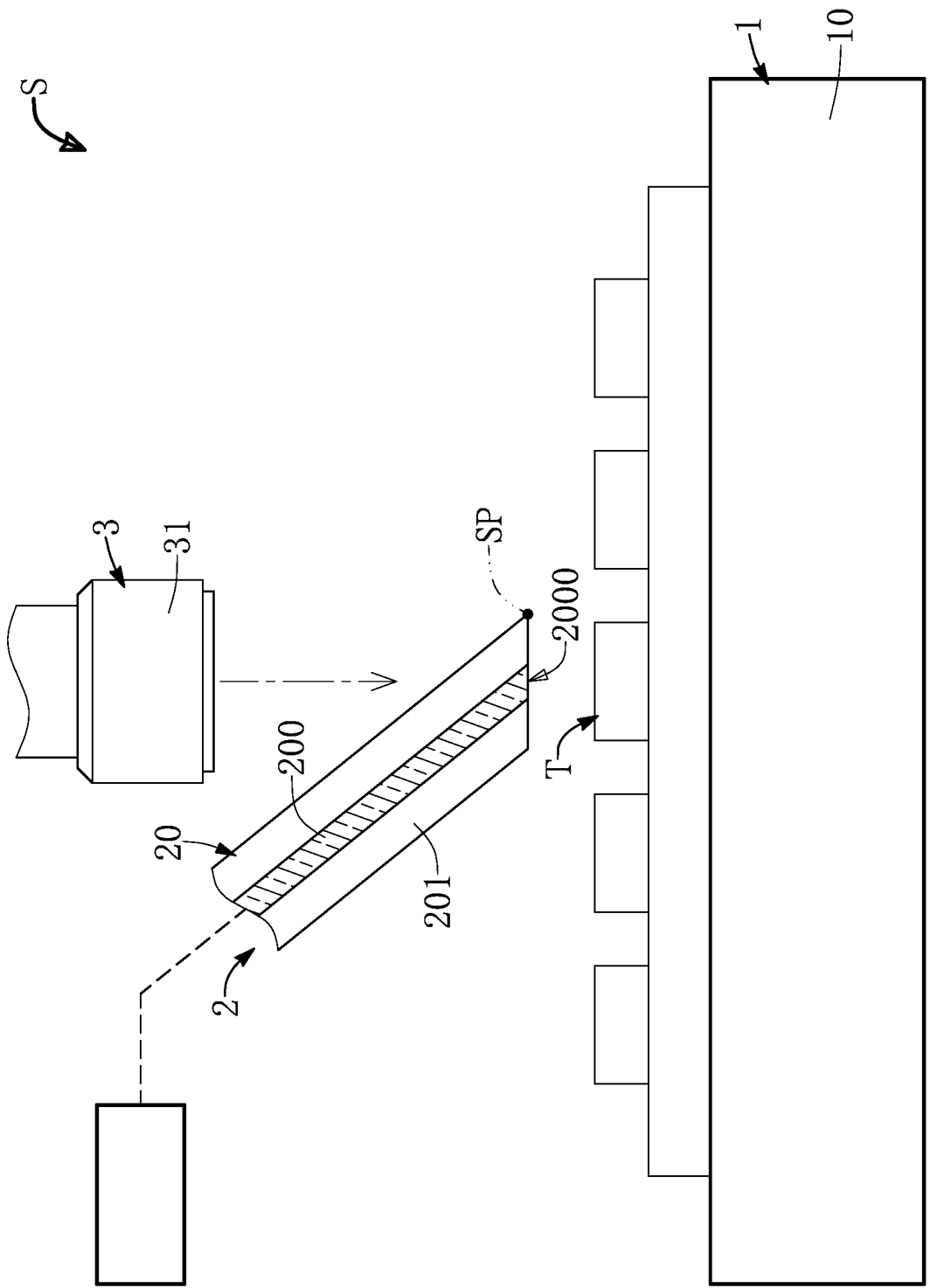
FIG. 2 is a schematic view of an optical detection system according to a first embodiment of the present disclosure.
Figure 3:
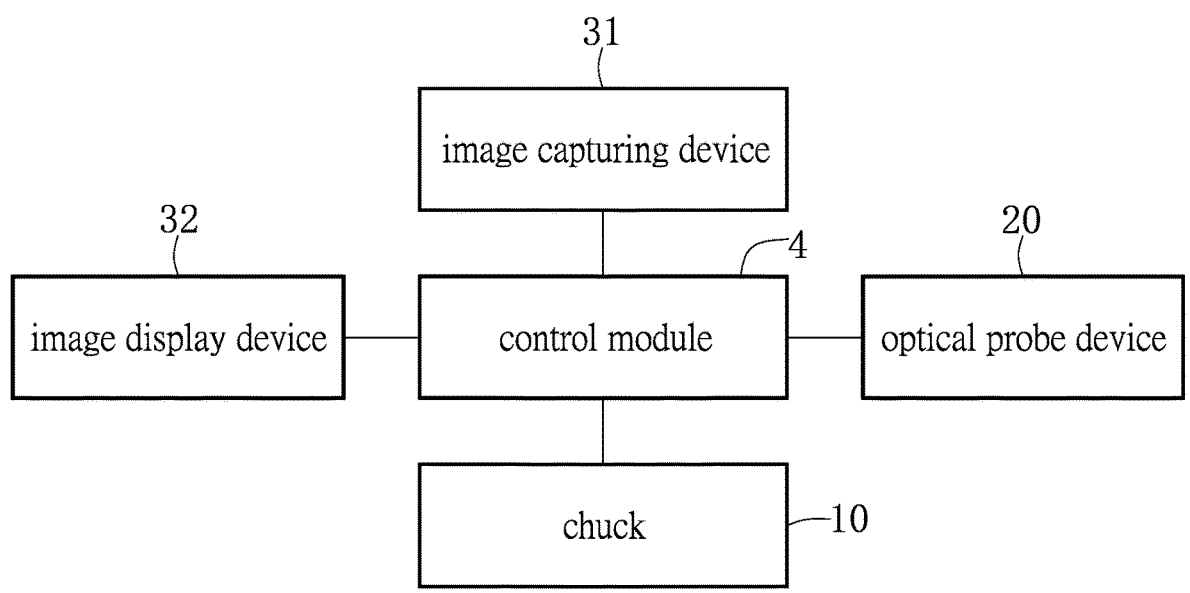
FIG. 3 is a functional block diagram of the optical detection system according to the first embodiment of the present disclosure.

More particularly, referring to FIG. 2 and FIG. 3, the chuck stage 1 includes a chuck 10 configured for carrying a plurality of predetermined objects to be tested (for example, a wafer for carrying a plurality of optical devices, and examples of the optical devices include a plurality of silicon photonics optical devices such as LEDs, micro LEDs, or any electronic chips can be held or suctioned by the chuck 10). Moreover, the optical detection module 2 includes an optical probe device 20, and the optical probe device 20 can be configured to be disposed above the chuck 10 for optically detecting the predetermined object. For example, the optical probe device 20 includes a plurality of optical fibers 200 (FIG. 2 shows only one of the optical fibers 200 connected to a laser generator) and an outer casing 201 configured for carrying the optical fibers 200, and each of the optical fibers 200 has a fiber end portion 2000 (such as a fiber tip portion) for receiving or outputting one or more optical signals. More specifically, the optical detection module 2 can be configured to perform any suitable optical and/or electrical test of the optical devices. As examples, the aforementioned tests may include providing an electrical test signal to the optical devices and receive a corresponding optical resultant signal from the optical devices, providing an optical test signal to the optical devices and receive a corresponding electrical resultant signal from the optical devices, and/or providing an optical test signal to the optical devices and receive a corresponding optical resultant signal from the optical devices. However, the aforementioned details are disclosed for exemplary purposes only, and are not meant to limit the scope of the present disclosure.

More particularly, referring to FIG. 2 and FIG. 3, the vision inspection module 3 includes an image capturing device 31 and an image display device 32. The image capturing device 31 can be configured for capturing a real-time image of the predetermined object in real time, and the image display device 32 can be configured for displaying the real-time image of the predetermined object in real time. For example, the image capturing device 31 can use a CCD (Charge-coupled Device) image sensor or a CMOS (Complementary Metal-Oxide-Semiconductor) image sensor. In addition, the control module 4 can be electrically connected to the chuck 10, the optical probe device 20, the image capturing device 31 and the image display device 32, for controlling the chuck 10, the optical probe device 20, the image capturing device 31 and the image display device 32, and the control module 4 can be configured to execute the alignment method for the predetermined target object T (i.e., the device under test (DUT) as shown in FIG. 4 to FIG. 11). However, the aforementioned details are disclosed for exemplary purposes only, and are not meant to limit the scope of the present disclosure.

It should be noted that, as shown in FIG. 2, the outer casing 201 of the optical probe device 20 has a selected visible reference point SP disposed thereon for corresponding to a selected one of the fiber end portions 2000, and the selected visible reference point SP of the outer casing 201 can be configured to be able to be identified by the image capturing device 31 from the top down. Therefore, the selected visible reference point SP selected from the outer casing 201 of the optical probe device 20 can be configured to determine a plane distance from the selected fiber end portion 2000 to one of the predetermined objects. That is to say, when the plane distance between the selected optical fiber end portion 2000 and the selected visible reference point SP was known in advance, the user can use the selected visible reference point SP to determine a plane distance from the selected fiber end portion 2000 to the predetermined target object T selected from the predetermined objects to be tested.

It should be noted that, as shown in FIG. 2, the selected visible reference point SP is disposed on the outer casing 201 of the optical probe device 20, so that the selected visible reference point SP can be configured to be able to be identified by the image capturing device 31 (that is to say, the user can view the selected visible reference point SP by cooperation of the image capturing device 31 and the image display device 32). Furthermore, the selected visible reference point SP provided by the outer casing 201 of the optical probe device 20 can correspond to the selected fiber end portion 2000, so that the user can obtain the position of the fiber end portion 2000 relative to the selected visible reference point SP through the selected visible reference point SP, and can determine a plane distance from the selected fiber end portion 2000 to one of the predetermined objects (i.e., the predetermined target object T).

The following is a detailed description of a possible or preferred embodiment of the optical detection system S that can be applied to perform a method for positioning a predetermined target object T.

Figure 4:
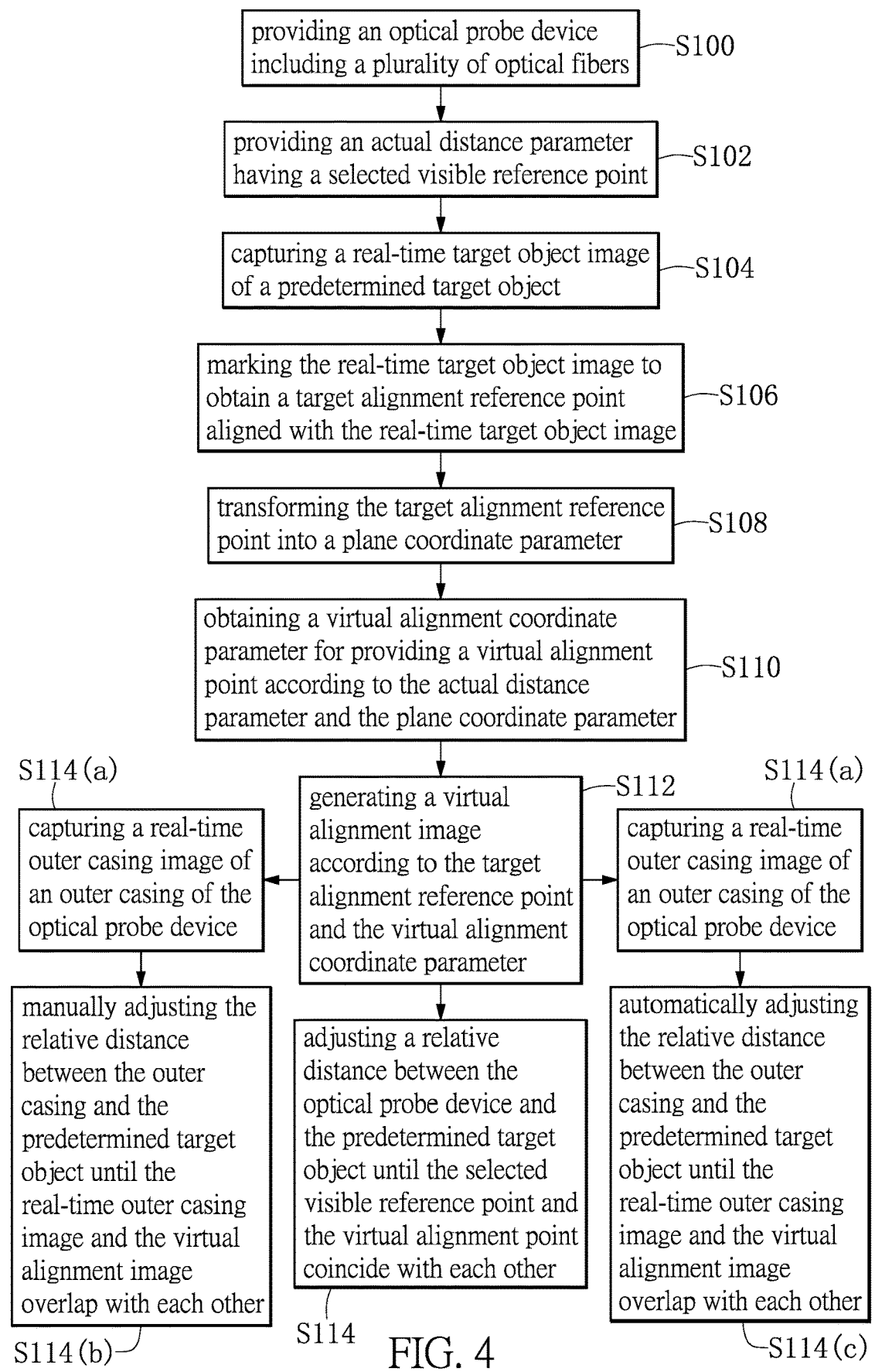
FIG. 4 is a flowchart of an alignment method for a predetermined target object according to the first embodiment of the present disclosure.
Figure 5:
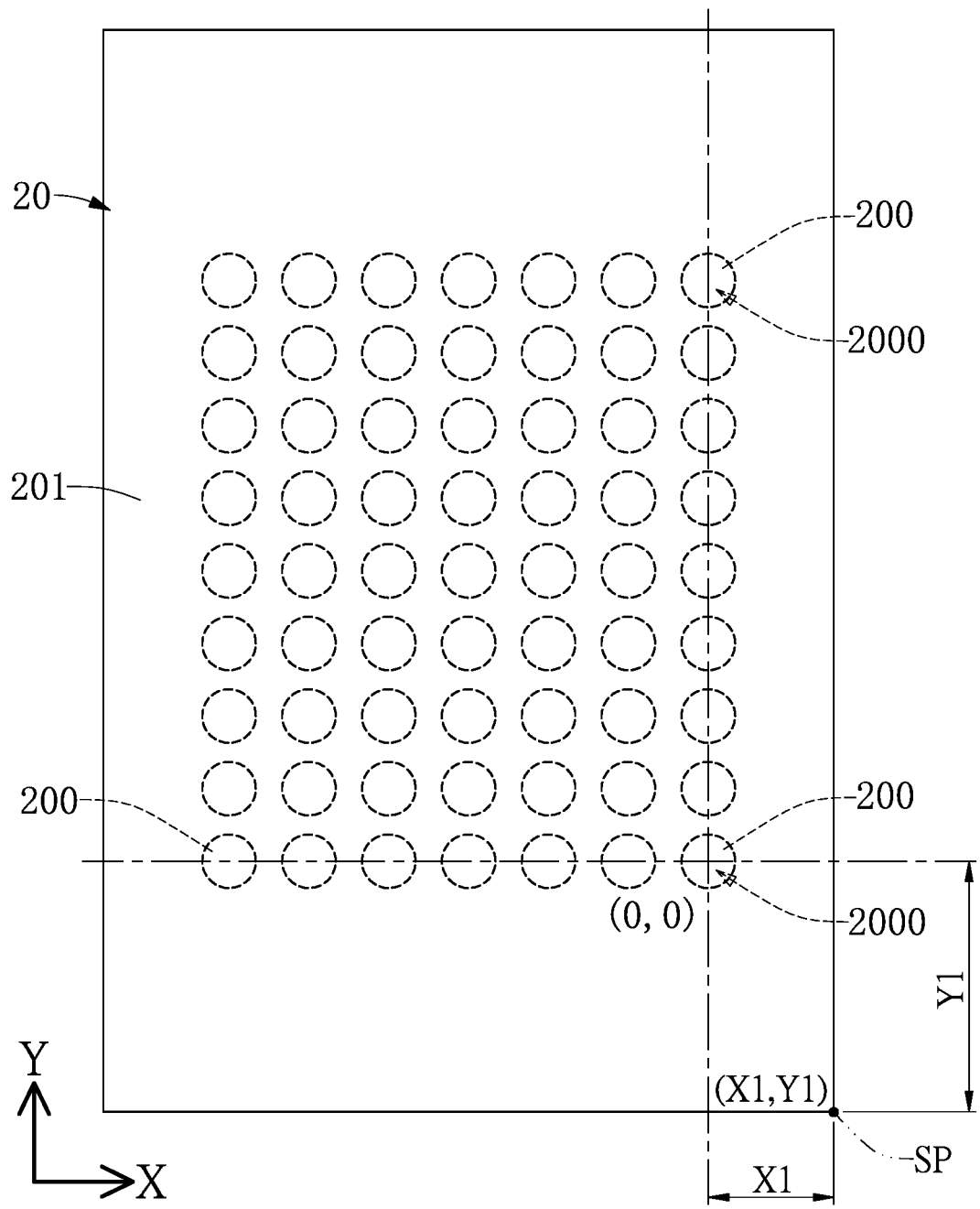
FIG. 5 is a schematic view of steps S100 and S102 of the alignment method for the predetermined target object according to the first embodiment of the present disclosure.

Firstly, referring to FIG. 2, FIG. 4 and FIG. 5, the alignment method for the predetermined target object T provided by the first embodiment of the present disclosure includes providing an optical probe device 20, in which the optical probe device 20 includes a plurality of optical fibers 200, and each of the optical fibers 200 has a fiber end portion 2000 for receiving or outputting one or more optical signals (step S100).

For example, referring to FIG. 2 and FIG. 5, the optical fibers 200 of the optical probe device 20 can be arranged in sequence to form an optical fiber array (FIG. 5 shows an example of an optical fiber array arranged in a 7×9 matrix) for simultaneously detecting a plurality of predetermined objects to be tested, and one of the predetermined objects is the predetermined target object T. Moreover, the optical probe device 20 includes an outer casing 201 (such as an external package casing) configured for carrying the fiber end portions 2000, and the selected visible reference point SP can be located at one of a plurality of corners of the outer casing 201 (for example, the selected visual reference point SP is located at the lower right corner of the outer casing 201 as shown in FIG. 5) or one of a plurality of fixed markers of the outer casing 201 (for example, a fixed marker can be pre-formed on the outer housing 201). Therefore, the selected visible reference point SP can be located at one of the corners of the outer casing 201 (for example, at a 90 degree corner on the top side of the outer casing 201), or one of the fixed markers of the outer casing 201 (for example, at a marker on the top side of the outer casing 201), so that the user can easily view the selected visible reference point SP that is captured by the image capturing device 31 from the top down through the image display device 32. However, the aforementioned details are disclosed for exemplary purposes only, and are not meant to limit the scope of the present disclosure.

For example, referring to FIG. 5, among all of the fiber end portions 2000, a selected fiber end portion 2000 (i.e., the fiber end portion 2000 in the lower right corner as shown in FIG. 5) can be closest to the selected visible reference point SP, so that the plane distance from the selected fiber end portion 2000 to the selected visible reference point SP is a shortest plane distance between the fiber end portion 2000 and the selected visible reference point SP. Therefore, among all of the fiber end portions 2000, the selected fiber end portion 2000 can be closer to the selected visible reference point SP than any one of the other fiber end portions 2000 (i.e., there is a shortest plane distance between the selected fiber end portion 2000 and the selected visible reference point SP), so that the user can quickly identify or find the relative position relationship among the selected fiber end portion 2000 and the selected visible reference point SP on the image display device 32. However, the aforementioned details are disclosed for exemplary purposes only, and are not meant to limit the scope of the present disclosure.

Next, referring to FIG. 2, FIG. 4 and FIG. 5, the alignment method for the predetermined target object T provided by the first embodiment of the present disclosure includes providing an actual distance parameter, in which the actual distance parameter is a plane distance on a plane between a selected one of the fiber end portions 2000 and a selected visible reference point SP provided by the optical probe device 20 (step S102).

For example, as shown in FIG. 5, the actual distance parameter includes an X1 value and a Y1 value, the X1 value is an interval between the selected fiber end portion 2000 and the selected visible reference point SP on an X-axis direction provided by the plane, and the Y1 value is an interval between the selected fiber end portion 2000 and the selected visible reference point SP on a Y-axis direction provided by the plane. That is to say, the actual distance parameter includes an X1 value and a Y1 value on an XY coordinate system provided by the plane (i.e., the actual distance parameter including the X1 value and the Y1 value is a coordinate parameter (X1, Y1) defined on the XY coordinate system), the X1 value is an interval between the selected fiber end portion 2000 and the selected visible reference point SP in an X-axis direction of the XY coordinate system provided by the plane, and the Y1 value is an interval between the selected fiber end portion 2000 and the selected visible reference point SP in a Y-axis direction of the XY coordinate system provided by the plane. In addition, taking numerical values as an example, as shown in FIG. 5, when "the selected visible reference point SP is located at the lower right corner of the outer casing 201" and "a selected one of the fiber end portions 2000 is in a lower right corner (i.e., the selected fiber end portion 2000)," the selected fiber end portion 2000 can be defined as the origin (0, 0), and the coordinate position of the selected visual reference point SP relative to the selected fiber end portion 2000 can be an X1 value (e.g., 100 μm) and a Y1 value (e.g., −200 μm) of the XY coordinate system. However, the aforementioned details are disclosed for exemplary purposes only, and are not meant to limit the scope of the present disclosure.

For example, as shown in FIG. 2, FIG. 3 and FIG. 5, the step S102 of providing the actual distance parameter further includes: inputting the X1 value and the Y1 value or inputting model information of the optical probe device 20 in a user interface (such as a numerical input interface provided by the image display device 32), and the model information of the optical probe device 20 contains the X1 value and the Y1 value (that is to say, the optical detection system S can be configured to convert the model information into the X1 value and the Y1 value base on the built-in datasheet prestored in the control module 4 of the optical detection system S). Therefore, the X1 value and the Y1 value, or the model information including the X1 value and the Y1 value can be selectively entered into a user interface by the user, so that the present disclosure can provide the user with more input options in the step S102 of providing the actual distance parameter. However, the aforementioned details are disclosed for exemplary purposes only, and are not meant to limit the scope of the present disclosure.

Figure 6:
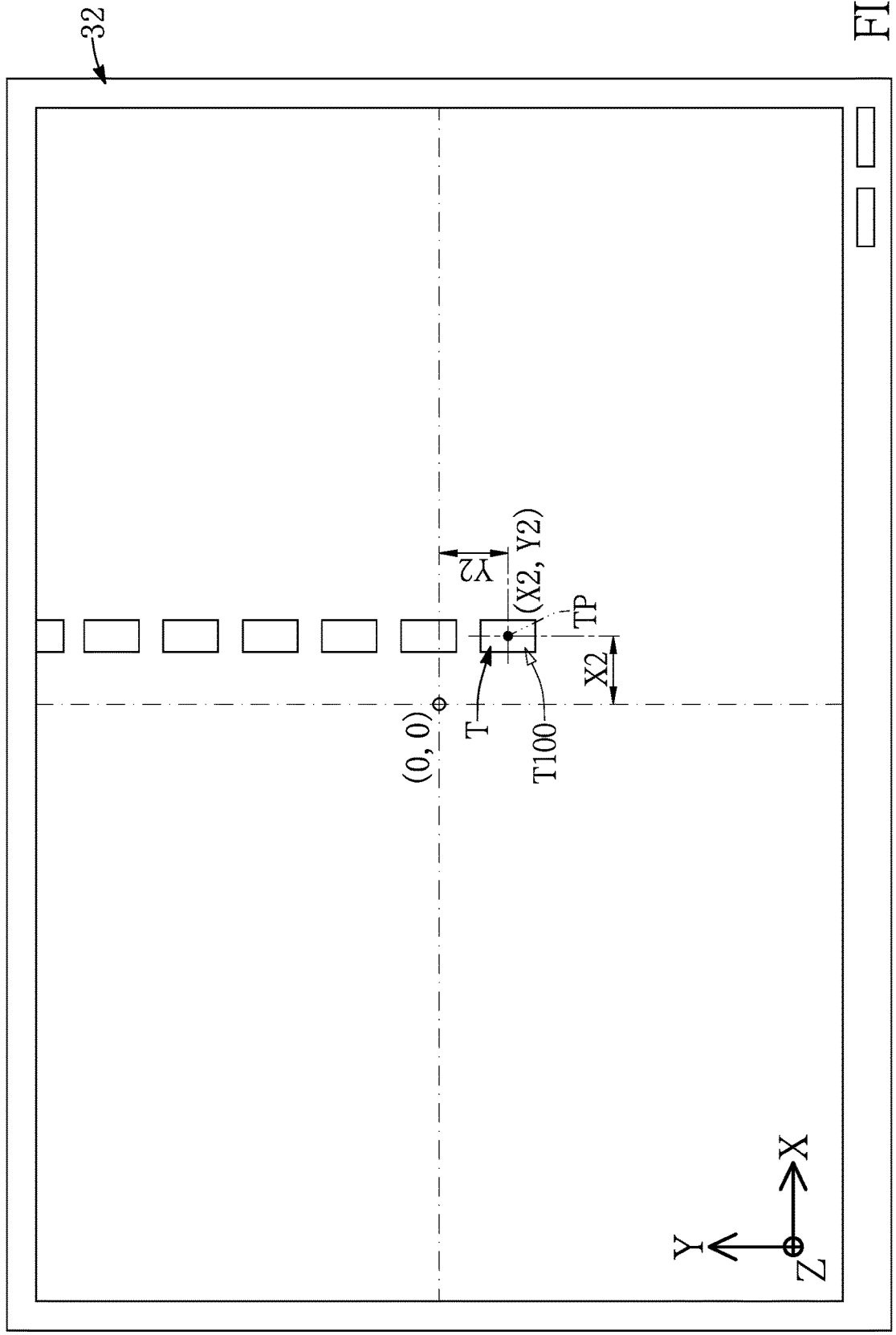
FIG. 6 is a schematic view of steps S104, S106 and S108 of the alignment method for the predetermined target object according to the first embodiment of the present disclosure.

Afterward, referring to FIG. 2, FIG. 4 and FIG. 6, the alignment method for the predetermined target object T provided by the first embodiment of the present disclosure includes capturing the predetermined target object T by an image capturing device 31 from the top down so as to display a real-time target object image T100 of the predetermined target object T on an image display device 32 in real time (step S104); and then marking the real-time target object image T100 of the predetermined target object T on the image display device 32 so as to obtain a target alignment reference point TP aligned with the real-time target object image T100 (step S106).

For example, referring to FIG. 2 and FIG. 6, in the step S106 of marking the real-time target object image T100 of the predetermined target object T on the image display device 32, the real-time target object image T100 can be marked by a movable marker that is controllable through an input device. Therefore, the real-time target object image T100 can be marked by using an input device (for example, by using an external device such as a mouse, or by using a touch module such as a touch panel screen provided by the image display device 32) to control a movable marker (such as a cursor displayed on the image display device 32), so that the present disclosure can provide the user with more input options in the step S106 of marking the real-time target object image T100 of the predetermined target object T on the image display device 32. Alternatively, in another possible or preferred embodiment, when the marker is fixed on the image display device 32, the user can use the input device to move the real-time target object image T100 relative to the fixed marker so as to mark the real-time target object image T100 of the predetermined target object T on the image display device 32. However, the aforementioned details are disclosed for exemplary purposes only, and are not meant to limit the scope of the present disclosure.

Next, referring to FIG. 2, FIG. 4 and FIG. 6, the alignment method for the predetermined target object T provided by the first embodiment of the present disclosure includes transforming the target alignment reference point TP that is aligned with the real-time target object image T100 into a plane coordinate parameter (step S108).

For example, referring to FIG. 2 and FIG. 6, the plane coordinate parameter includes an X2 value and a Y2 value on an XY coordinate system provided by the image display device 32, the X2 value is a distance from the target alignment reference point TP to a Y-axis of the XY coordinate system provided by the image display device 32, and the Y2 value is a distance from the target alignment reference point TP to a Y-axis of the XY coordinate system provided by the image display device 32. In addition, taking numerical values as an example, as shown in FIG. 6, relative to the origin (0, 0) of the XY coordinate system provided by the image display device 32, the coordinate position of the target alignment reference point TP relative to the origin (0, 0) of the XY coordinate system can be an X2 value (e.g., 50 μm) and a Y2 value (e.g., −50 μm) of the XY coordinate system. However, the aforementioned details are disclosed for exemplary purposes only, and are not meant to limit the scope of the present disclosure.

Next, referring to FIG. 3 to FIG. 7, the alignment method for the predetermined target object T provided by the first embodiment of the present disclosure includes: according to the actual distance parameter and the plane coordinate parameter, obtaining a virtual alignment coordinate parameter for providing a virtual alignment point VP, in which a distance from the target alignment reference point TP to the virtual alignment point VP is equal to a distance from the selected fiber end portion 2000 to the selected visible reference point SP (step S110).

Figure 7:
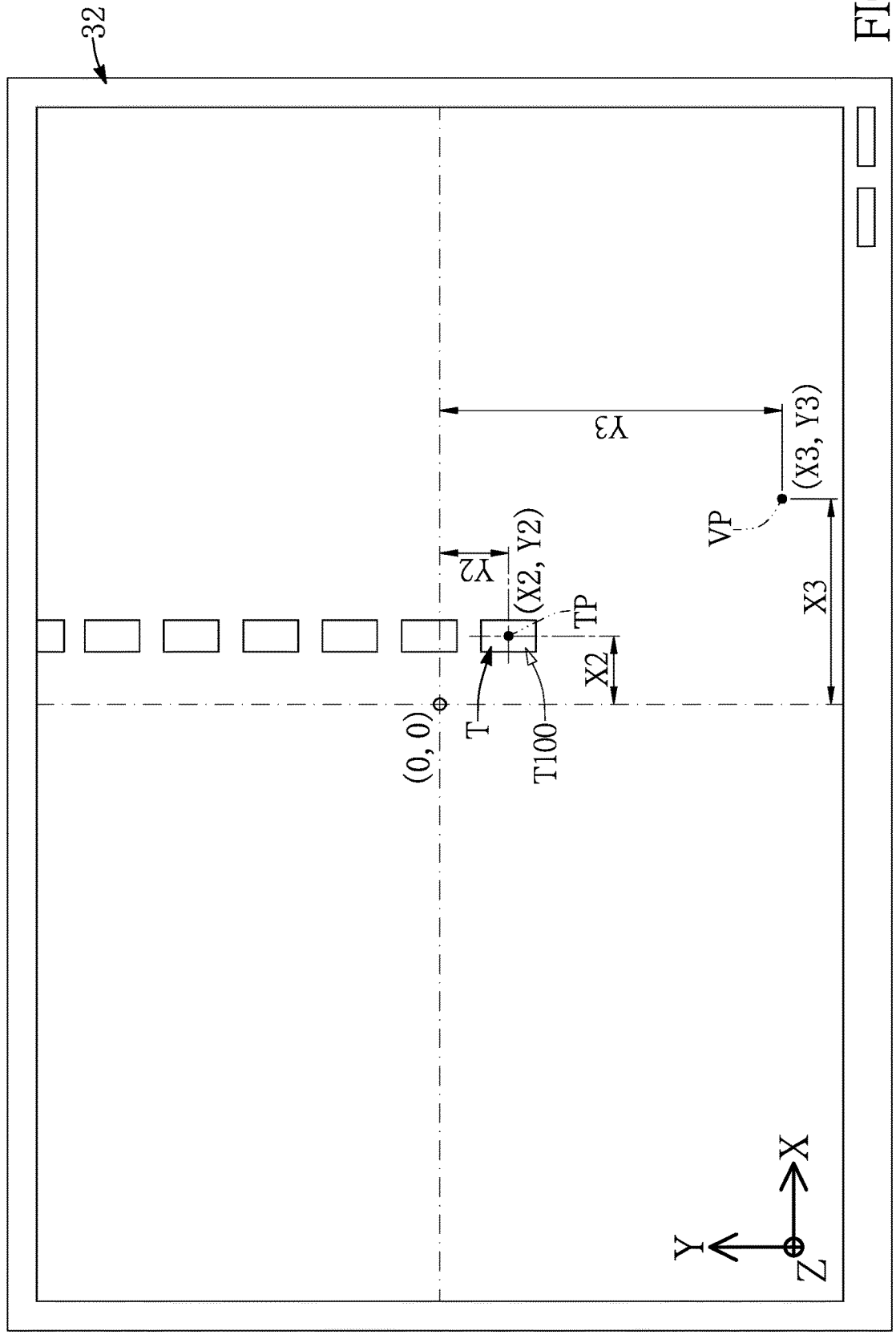
FIG. 7 is a schematic view of step S110 of the alignment method for the predetermined target object according to the first embodiment of the present disclosure.

For example, referring to FIG. 3 and FIG. 7, in the step S110 of obtaining the virtual alignment coordinate parameter, the virtual alignment coordinate parameter is obtained by calculating the actual distance parameter and the plane coordinate parameter through a control module 4, and the virtual alignment point VP is selectively displayed or not displayed on the image display device 32 (as shown in FIG. 7, the virtual alignment point VP can be displayed on the image display device 32). However, the aforementioned details are disclosed for exemplary purposes only, and are not meant to limit the scope of the present disclosure.

For example, referring to FIG. 5, FIG. 6 and FIG. 7, the virtual alignment coordinate parameter includes an X3 value obtained by adding the X1 value and the X2 value, and a Y3 value obtained by adding the Y1 value and the Y2 value, in which, the X3 value and the Y3 value are on the XY coordinate system that are provided by the image display device 32, the X3 value is a distance from the virtual alignment point VP to a Y-axis of the XY coordinate system provided by the image display device 32, and the Y3 value is a distance from the virtual alignment point VP to an X-axis of the XY coordinate system provided by the image display device 32. In addition, taking numerical values as an example, the X3 value shown in FIG. 7 is 150 μm obtained by adding the X1 value (i.e., 100 μm) and the X2 value (i.e., 50 μm), and the Y3 value shown in FIG. 7 is −250 μm obtained by adding the Y1 value (i.e., −200 μm) and the Y2 value (i.e., −50 μm). That is to say, as shown in FIG. 7, relative to the origin (0, 0) of the XY coordinate system provided by the image display device 32, the coordinate position of the virtual alignment point VP relative to the origin (0, 0) of the XY coordinate system can be the X3 value (e.g., 150 μm) and the Y3 value (e.g., −250 μm) of the XY coordinate system. It should be noted that, as shown in FIG. 5 and FIG. 7, the distance from the target alignment reference point TP to the virtual alignment point VP (i.e., in the XY coordinate system shown in FIG. 7, the X coordinate value obtained by subtracting the X2 value from the X3 value, and the Y coordinate value obtained by subtracting the Y2 value from the Y3 value) is substantially equal to a distance from the selected fiber end portion 2000 to the selected visible reference point SP (i.e., the X1 value and the Y1 value of the XY coordinate system as shown in FIG. 5). However, the aforementioned details are disclosed for exemplary purposes only, and are not meant to limit the scope of the present disclosure.

Therefore, referring to FIG. 5, FIG. 6 and FIG. 7, the actual distance parameter can provide the X1 value and the Y1 value on the XY coordinate system provided by a plane (that is to say, as shown in FIG. 5, on the XY coordinate system provided by the plane, a plane distance between the selected fiber end portion 2000 and the selected visible reference point SP can be presented by the X1 value and the Y1 value), and the plane coordinate parameter can provide the X2 value and the Y2 value on the XY coordinate system provided by the image display device 32 (that is to say, as shown in FIG. 6, on the XY coordinate system provided by the image display device 32, the distance of the target alignment reference point TP relative to the origin (0, 0) of the XY coordinate system can be presented by the X2 value and the Y2 value), so that the X3 value obtained by adding the X1 value and X2 value, and the Y3 value obtained by adding the Y1 value and the Y2 value can be presented on the XY coordinate system provided by the image display device 32, so that the X3 value obtained by adding the X1 value and the X2 value, and the Y3 value obtained by adding the Y1 value and the Y2 value can be presented on the XY coordinate system provided by the image display device 32. Hence, the virtual alignment coordinate parameter can provide the X3 value and the Y3 value through the XY coordinate system provided by the image display device 32 (that is to say, as shown in FIG. 7, on the XY coordinate system provided by the image display device 32, the distance of the virtual alignment point VP relative to the origin (0, 0) of the XY coordinate system can be presented by the X3 value and the Y3 value).

Afterward, referring to FIG. 4, FIG. 5, FIG. 7 and FIG. 8, the alignment method for the predetermined target object T provided by the first embodiment of the present disclosure includes: according to the target alignment reference point TP and the virtual alignment coordinate parameter (i.e., the virtual alignment point VP for providing the X3 value and the Y3 value), generating a virtual alignment image VM that is displayed on the image display device 32 (step S112).

Figure 8:
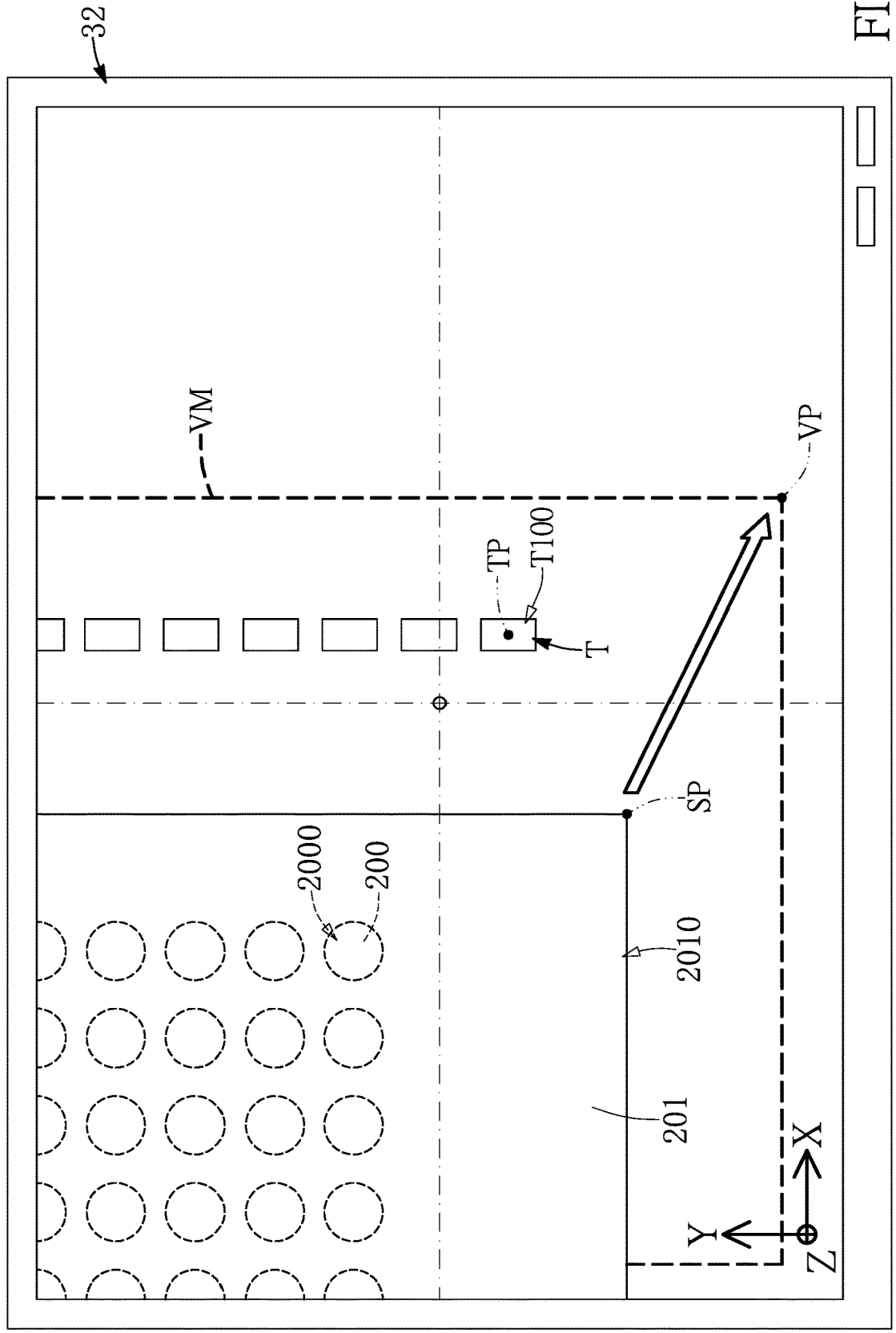
FIG. 8 is a schematic view of steps S112 and S114(a) of the alignment method for the predetermined target object according to the first embodiment of the present disclosure.

For example, referring to FIG. 5 and FIG. 8, the virtual alignment image VM can be formed by extending leftward and upward from the virtual alignment point VP, and both an outer contour of the virtual alignment image VM and an outer contour of the outer casing 201 are completely or partially the same. Taking the virtual alignment image VM shown on the image display device 32 in FIG. 8 as an example, the outer contour of the virtual alignment image VM and the outer contour of the outer casing 201 can be completely the same square. In addition, when the outer contour of the virtual alignment image VM is L-shaped, the L-shaped outer contour of the virtual alignment image VM can correspond to the L-shaped outer contour at any corner of the outer casing 201. Therefore, the outer contour (such as a square contour or an L-shape contour) of the virtual alignment image VM and the outer contour (such as a square contour or an L-shape contour) of the outer casing 201 can be identical or partially identical, so that the present disclosure can provide the user with more customized options about the virtual alignment image VM. However, the aforementioned details are disclosed for exemplary purposes only, and are not meant to limit the scope of the present disclosure.

Then, referring to FIG. 2, FIG. 4, FIG. 8 and FIG. 9, the alignment method for the predetermined target object T provided by the first embodiment of the present disclosure includes adjusting a relative distance between the optical probe device 20 and the predetermined target object T until the selected visible reference point SP and the virtual alignment point VP coincide with each other on the image display device 32, so that the selected fiber end portion 2000 is correctly aligned with the predetermined target object T in a vertical direction (i.e., the Z-axis direction) (step S114).

Figure 9:
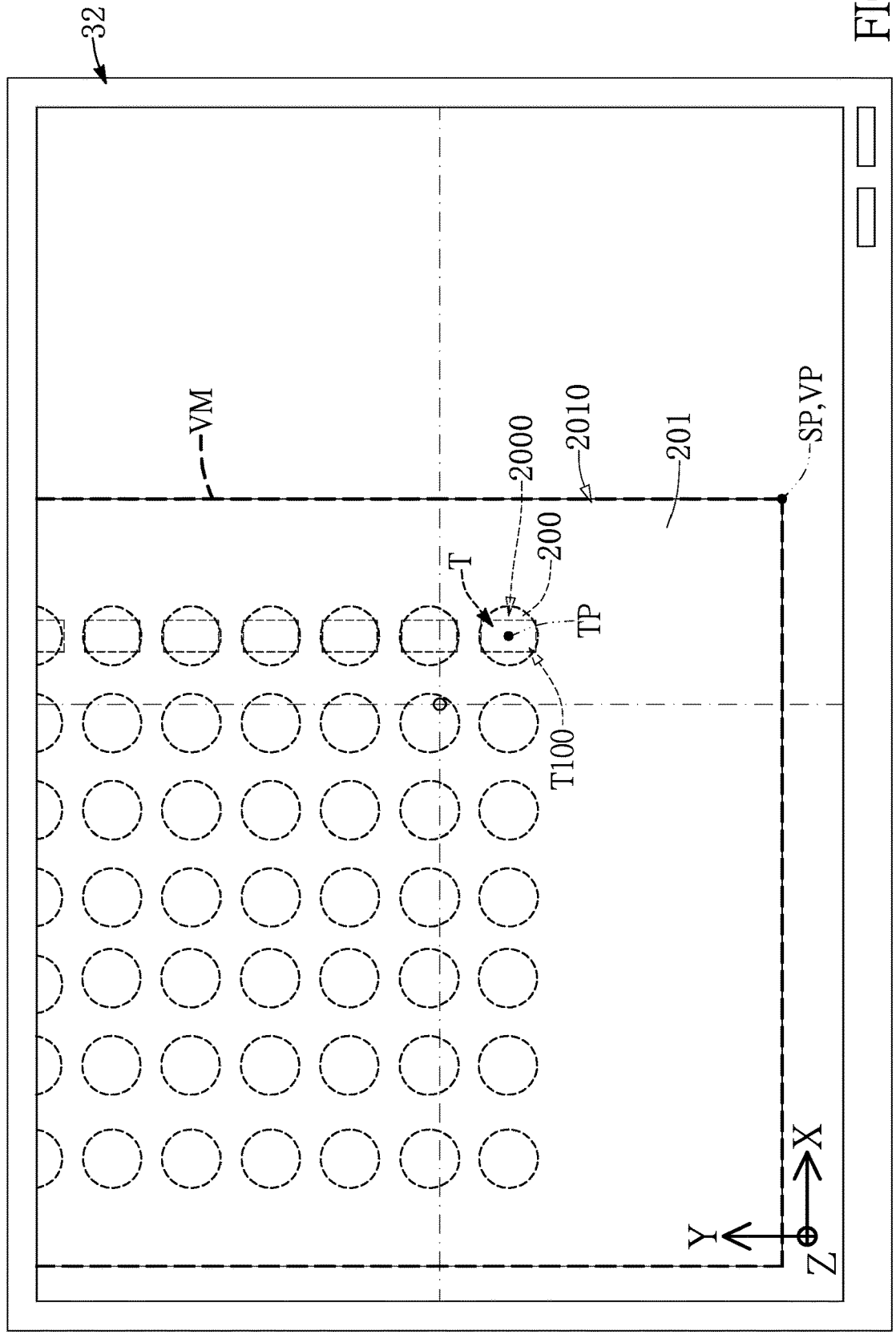
FIG. 9 is a schematic view of steps S114 and S114(b) of the alignment method for the predetermined target object according to the first embodiment of the present disclosure.

For example, referring to FIG. 2, FIG. 4, FIG. 8 and FIG. 9, in the step S114 of adjusting the relative distance between the optical probe device 20 and the predetermined target object T, the alignment method for the predetermined target object T provided by the first embodiment of the present disclosure further includes: firstly, referring to FIG. 2 and FIG. 8, capturing an outer casing 201 of the optical probe device 20 by the image capturing device 31 so as to display a real-time outer casing image 2010 of the outer casing 201 on the image display device 32 in real time (step S114(*a*)); and then referring to FIG. 2, FIG. 8 and FIG. 9, manually adjusting the relative distance between the outer casing 201 and the predetermined target object T (for example, according to different requirements, the outer casing 201 can be moved relative to the predetermined target object T such as in the direction of the arrow as shown in FIG. 8, or the predetermined target object T can be moved relative to the outer casing 201 such as in the direction opposite to the arrow as shown in FIG. 8) until the real-time outer casing image 2010 and the virtual alignment image VM that are displayed on the image display device 32 overlap with each other (step S114(*b*)), in which, at least one contour line of the real-time outer casing image 2010 corresponds to at least one contour line of the virtual alignment image VM. Therefore, the virtual alignment point VP can be displayed on the image display device 32, so that the present disclosure can manually adjust a relative distance between the optical probe device 20 and the predetermined target object T according to the virtual alignment point VP displayed on the image display device 32 until the selected visual reference point SP and the virtual alignment point VP are aligned (or coincided) with each other on the image display device 32. However, the aforementioned details are disclosed for exemplary purposes only, and are not meant to limit the scope of the present disclosure.

For example, referring to FIG. 8 and FIG. 9, the virtual alignment image VM displayed on the image display device 32 can be translucent so as to allow the user to view the real-time outer casing image 2010 that is displayed on the image display device 32. Furthermore, in an overlapping relationship in a Z-axis direction (i.e., the Z-axis direction of the XYZ coordinate system provided by the image display device 32) between the virtual alignment image VM, the real-time target object image T100 and the real-time outer casing image 2010 that are displayed on the image display device 32, the virtual alignment image VM is located at an uppermost layer, the real-time target object image T100 is located at a bottommost layer, and the real-time outer casing image 2010 is located between the virtual alignment image VM and the real-time target object image T100. Therefore, the virtual alignment image VM displayed on the image display device 32 can be translucent, so that when the virtual alignment image VM is located on the uppermost layer in the overlapping relationship in the Z-axis direction, the real-time outer casing image 2010 is not completely blocked by the virtual alignment image VM, thereby the user can still view the real-time outer casing image 2010 of the outer casing 201 through the image display device 32. However, the aforementioned details are disclosed for exemplary purposes only, and are not meant to limit the scope of the present disclosure.

Figure 10:
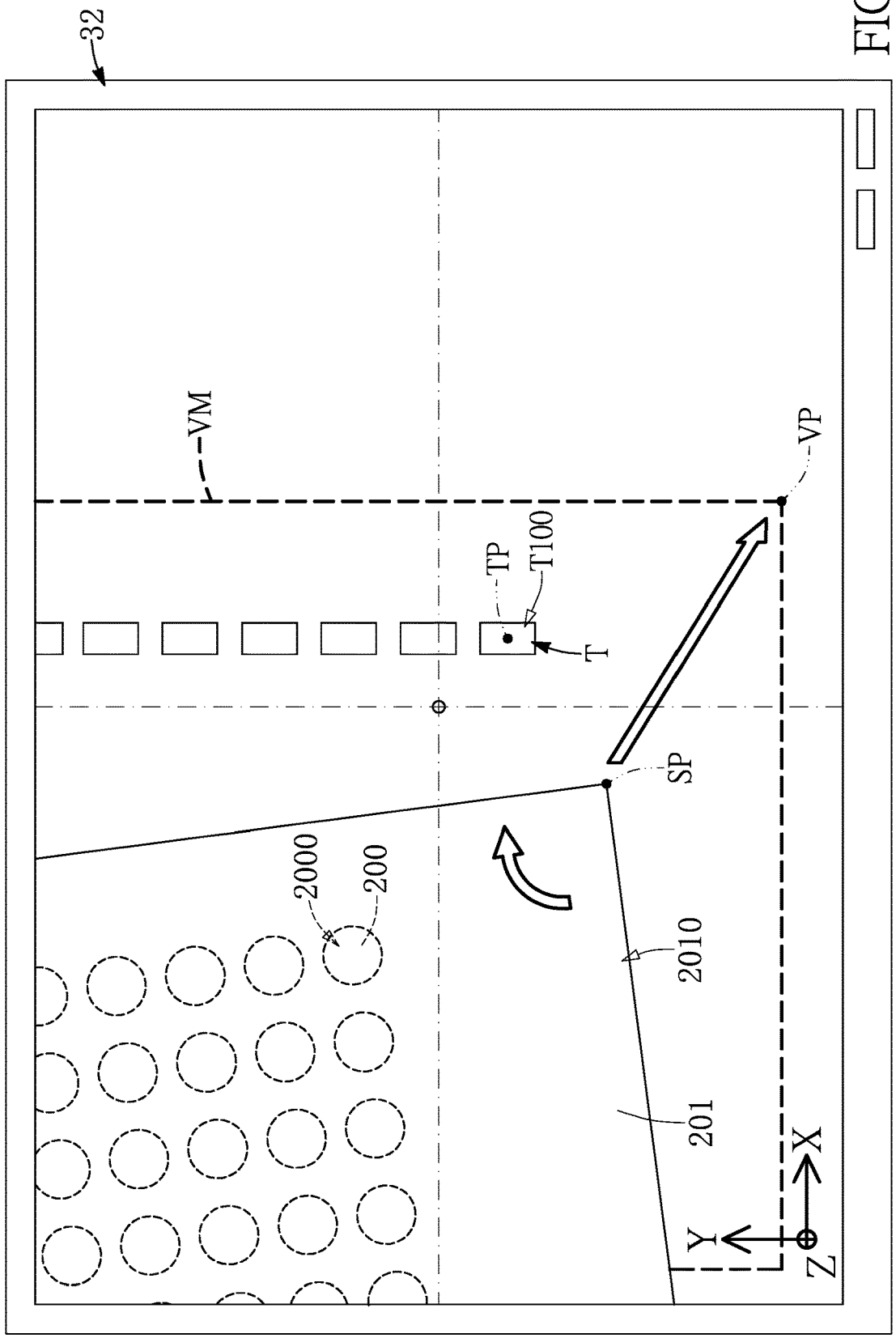
FIG. 10 is a schematic view of an outer casing of an optical probe device manually rotated relative to a virtual alignment image display on an image display device according to the first embodiment of the present disclosure.
Figure 11:
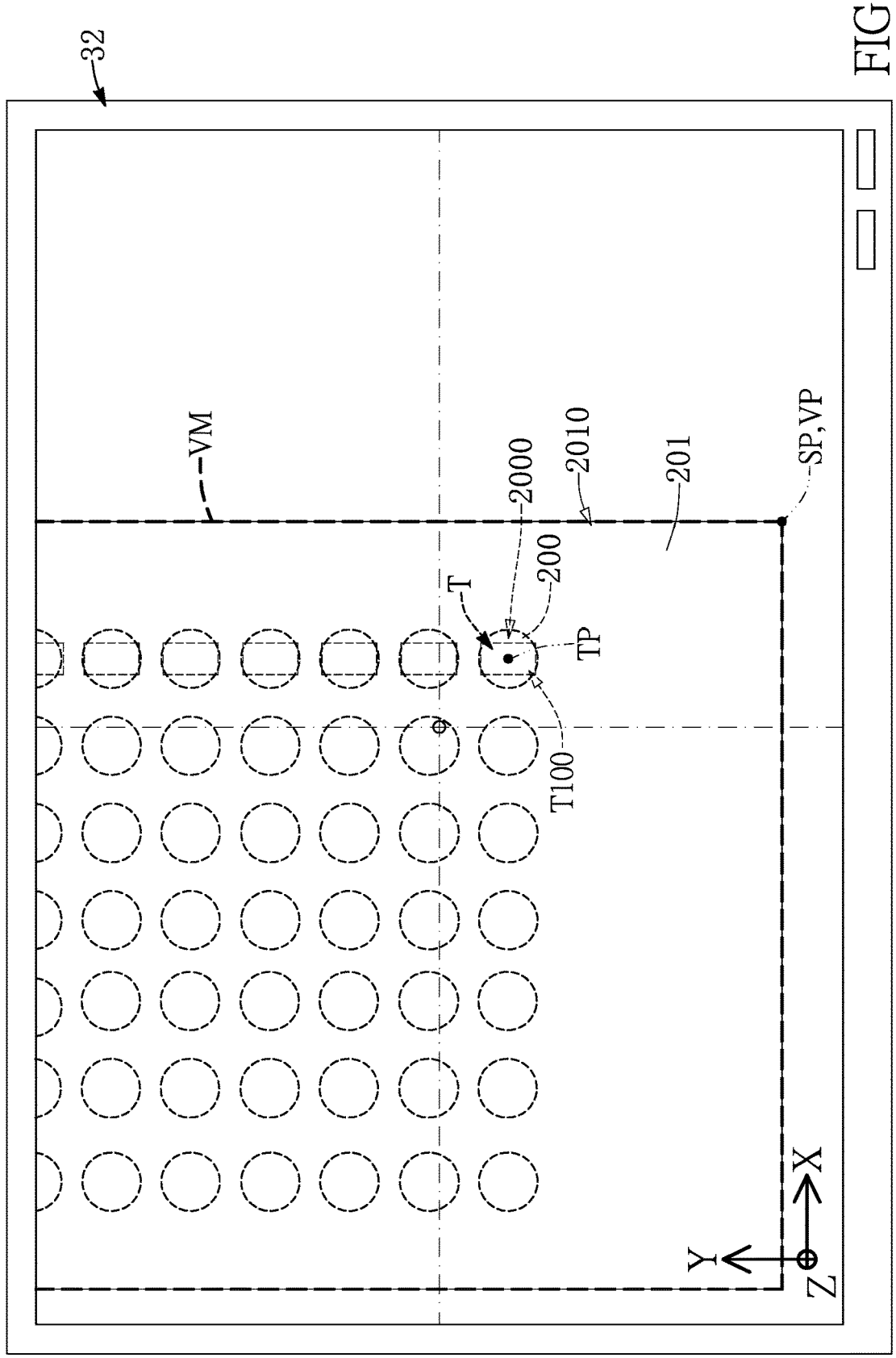
FIG. 11 is a schematic view of a real-time outer casing image and the virtual alignment image completely overlapping with each other on the image display device according to the first embodiment of the present disclosure.

For example, referring to FIG. 2, FIG. 10 and FIG. 11, in the step S114 of adjusting the relative distance between the optical probe device 20 and the predetermined target object T, the alignment method for the predetermined target object T provided by the first embodiment of the present disclosure further includes when the at least one contour line of the real-time outer casing image 2010 is offset (or deviates) from the at least one contour line of the virtual alignment image VM (for example, as shown in FIG. 10, the real-time outer casing image 2010 relative to a Z-axis is crooked or askew by a deviation of rotation angle), manually rotating the outer casing 201 of the optical probe device 20 relative to a Z-axis of an XYZ coordinate system (the Z axis of the XYZ coordinate system can be perpendicular to the X axis and the Y axis of the XY coordinate system) provided by the image display device 32 (for example, rotating in the direction of the rotating arrow as shown in FIG. 10) until the at least one contour line (e.g. a square outline) of the real-time outer casing image 2010 and the at least one contour line (e.g. a square outline) of the virtual alignment image VM overlap with each other or are parallel to each other (as shown in FIG. 11). However, the aforementioned details are disclosed for exemplary purposes only, and are not meant to limit the scope of the present disclosure.

Therefore, referring to FIG. 2 and FIG. 8 to FIG. 11, the virtual alignment image VM can be generated or provided on the image display device 32 relative to the virtual alignment point VP (as shown in FIG. 8), so that the user can manually adjust a relative distance between the outer casing 201 and the predetermined target object T in the X-axis direction and Y-axis direction (for example, according to different requirements, moving the position of the real-time outer casing image 2010 of the outer casing 201 relative to the virtual alignment image VM on the image display device 32 such as in the direction of the arrow as shown in FIG. 8, or moving the position of the virtual alignment image VM on the image display device 32 relative to the real-time outer casing image 2010 of the outer casing 201 such as in the direction opposite to the arrow as shown in FIG. 8), or manually rotate the outer casing 201 of the optical probe device 20 relative to the Z-axis (for example, according to different requirements, rotating the angle of the real-time outer casing image 2010 of the outer casing 201 around the Z-axis relative to the virtual alignment image VM on the image display device 32 as shown in FIG. 10, or rotating the angle of the virtual alignment image VM on the image display device 32 around the Z-axis relative to the real-time outer casing image 2010 of the outer casing 201) according to the virtual alignment image VM that is displayed on the image display device 32 until the real-time outer casing image 2010 and the virtual alignment image VM completely overlap with each other on the image display device 32 (as shown in FIG. 9 and FIG. 10), so that the selected fiber end portion 2000 can be correctly aligned with the predetermined target object T in a vertical direction (that is to say, on the image display device 32, the selected fiber end portion 2000 can be correctly aligned with the real-time target object image T100 of the predetermined target object T in a vertical direction).

For example, referring to FIG. 2, FIG. 4, FIG. 8 and FIG. 10, after the step S110 of obtaining the virtual alignment coordinate parameter, the alignment method for the predetermined target object T provided by the first embodiment of the present disclosure further includes: according to the target alignment reference point TP and the virtual alignment coordinate parameter, generating a virtual alignment image VM that is not displayed on the image display device 32. That is to say, in another possible embodiment, the virtual alignment image VM shown in FIG. 8 and FIG. 10 cannot be displayed on the image display device 32, and only the control module 4 can be configured to recognize the position of the virtual alignment image VM by itself. However, the aforementioned details are disclosed for exemplary purposes only, and are not meant to limit the scope of the present disclosure.

For example, in the case where the virtual alignment image VM shown in FIG. 8 is not displayed on the image display device 32 (only the control module 4 can identify the position of the virtual alignment image VM by itself), in the step S114 of adjusting the relative distance between the optical probe device 20 and the predetermined target object T, the alignment method for the predetermined target object T provided by the first embodiment of the present disclosure further includes: firstly, referring to FIG. 2 and FIG. 8, capturing an outer casing 201 of the optical probe device 20 by the image capturing device 31 so as to display a real-time outer casing image 2010 of the outer casing 201 on the image display device 32 in real time (step S114(*a*)); and then automatically adjusting the relative distance between the outer casing 201 and the predetermined target object T until the real-time outer casing image 2010 and the virtual alignment image (not shown by the image display device 32) overlap with each other (step S114(*c*)), in which, at least one contour line of the real-time outer casing image 2010 corresponds to at least one contour line of the virtual alignment image (not shown by the image display device 32) that is not displayed on the image display device 32. However, the aforementioned details are disclosed for exemplary purposes only, and are not meant to limit the scope of the present disclosure.

For example, in the case where the virtual alignment image VM shown in FIG. 10 is not displayed on the image display device 32 (only the control module 4 can identify the position of the virtual alignment image VM by itself), in the step S114 of adjusting the relative distance between the optical probe device 20 and the predetermined target object T, the alignment method for the predetermined target object T provided by the first embodiment of the present disclosure further includes when the at least one contour line of the real-time outer casing image 2010 is offset (or deviates) from the at least one contour line of the virtual alignment image by such as a deviation of rotation angle (not shown by the image display device 32), automatically rotating the outer casing 201 of the optical probe device 20 relative to a Z-axis of an XYZ coordinate system provided by the image display device 32 until the at least one contour line of the real-time outer casing image 2010 and the at least one contour line of the virtual alignment image (not shown by the image display device 32) overlap with each other or are parallel to each other. However, the aforementioned details are disclosed for exemplary purposes only, and are not meant to limit the scope of the present disclosure.

Therefore, referring to FIG. 2, FIG. 4, FIG. 8 and FIG. 10, the virtual alignment image (not shown) is not generated on the image display device 32 relative to the virtual alignment point VP, so that the control module 4 of the optical detection system S can automatically adjust a relative distance between the outer casing 201 and the predetermined target object T in the X-axis direction and Y-axis direction (i.e., moving the position of the real-time outer casing image 2010 of the outer casing 201 relative to the virtual alignment image on the image display device 32), or automatically rotate the outer casing 201 of the optical probe device 20 relative to the Z-axis (i.e., rotating the angle of the real-time outer casing image 2010 of the outer casing 201 relative to the virtual alignment image on the image display device 32) according to the virtual alignment image that is not displayed on the image display device 32 until the real-time outer casing image 2010 and the virtual alignment image (not shown) completely overlap with each other on the image display device 32, so that the selected fiber end portion 2000 can be automatically and correctly aligned with the predetermined target object T in a vertical direction, which can effectively save the user's time to manually adjust the optical probe device 20.

In conclusion, referring to FIG. 2 to FIG. 11, in the alignment method for the predetermined target object T provided by the first embodiment of the present disclosure, one of the fiber end portions 2000 (i.e., a selected fiber end portion 2000 such as a fiber tip portion) and a visible reference point (i.e., a selected visible reference point SP provided by the optical probe device 20) are preselected from the optical probe device 20 so as to obtain "an actual distance parameter" between the selected fiber end portion 2000 and the selected visible reference point SP (i.e., the step of defining the optical probe device 20). Next, on the image display device 32, the real-time target object image T100 of the predetermined target object T is marked so as to obtain a target alignment reference point TP aligned with the real-time target object image T100, and obtain "a plane coordinate parameter" that is transformed from the target alignment reference point TP (i.e., the step of defining the predetermined target object T). Then, according to the actual distance parameter and the plane coordinate parameter, a virtual alignment point VP (such as a virtual alignment image VM generated based on the virtual alignment point VP) corresponding to the selected visible reference point SP is obtained, which can be provided to the user (or operator) for reference (i.e., the step of defining the virtual alignment point VP). Finally, the user can adjust a relative distance between the optical probe device 20 and the predetermined target object T under the condition of simultaneously viewing the selected visible reference point SP and the virtual alignment point VP until the selected visible reference point SP and the virtual alignment point VP overlap with each other on the image display device 32 (at this time, the selected fiber end portion 2000 is correctly aligned with the predetermined target object T in a vertical direction), so that the optical fibers 200 (such as the same row of the optical fibers 200 as shown in FIG. 9) can respectively and correctly correspond to the predetermined objects (such as LEDs, micro LEDs, or any electronic chips).

It should be noted that, the virtual alignment point VP can be displayed on the image display device 32, so that the present disclosure can manually adjust a relative distance between the optical probe device 20 (i.e., the outer casing 201) and the predetermined target object T according to the virtual alignment point VP displayed on the image display device 32 (or when the virtual alignment point VP displayed on the image display device 32 cannot be recognized by the user and can only be recognized by the control module 4, the present disclosure can also automatically adjust a relative distance between the optical probe device 20 (i.e., the outer casing 201) and the predetermined target object T according to the virtual alignment point VP that is not displayed on the image display device 32) until the selected visual reference point and the virtual alignment point VP are aligned (or coincided) with each other on the image display device 32.

Second Embodiment

Comparing FIG. 12 with FIG. 5, and comparing FIG. 13 with FIG. 7, the main difference between the second embodiment and the first embodiment is as follows: in the second embodiment, the selected visual reference point SP can replace "being located at the lower right corner of the outer housing 201" with "being located at the lower left corner of the outer housing 201," and the selected fiber end portion 2000 can replace "a selected one of the fiber end portions 2000 is in a lower right corner" with "a selected one of the fiber end portions 2000 is in a lower left corner."

Figure 12:
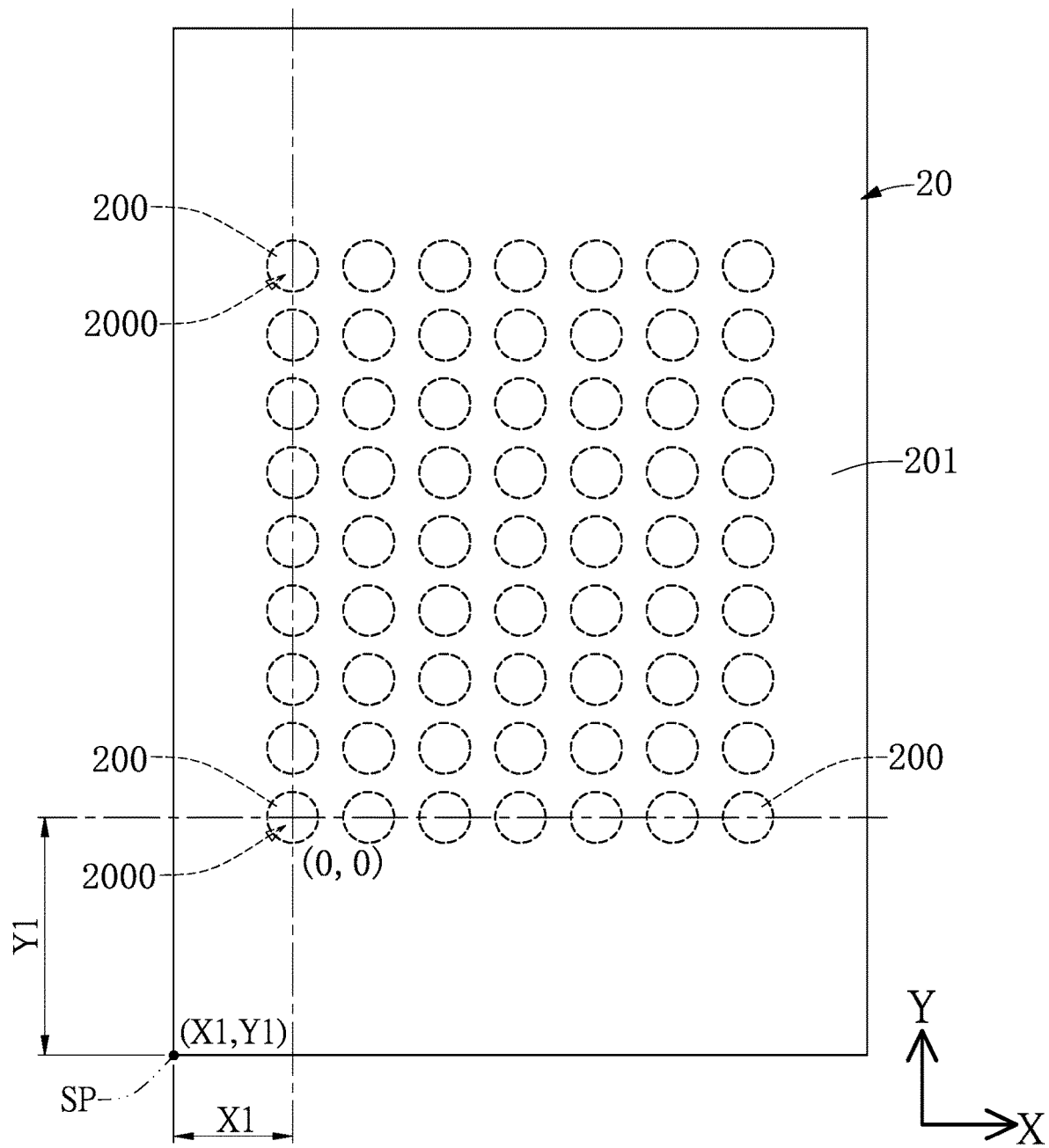
FIG. 12 is a schematic view of an actual distance parameter providing an X1 value and a Y1 value on an XY coordinate system provided by a plane (a selected visible reference point is located at a lower left corner of the outer casing, and a selected one of the fiber end portions is in the lower left corner) according to a second embodiment of the present disclosure.

More particularly, in the second embodiment, as shown in FIG. 12, when "the selected visible reference point SP is located at the lower left corner of the outer casing 201" and "a selected one of the fiber end portions 2000 is in a lower left corner (i.e., the selected fiber end portion 2000)," the selected fiber end portion 2000 can be defined as the origin (0, 0), and the coordinate position of the selected visual reference point SP relative to the selected fiber end portion 2000 can be an X1 value (e.g., −100 μm) and a Y1 value (e.g., −200 μm) of the XY coordinate system.

Figure 13:
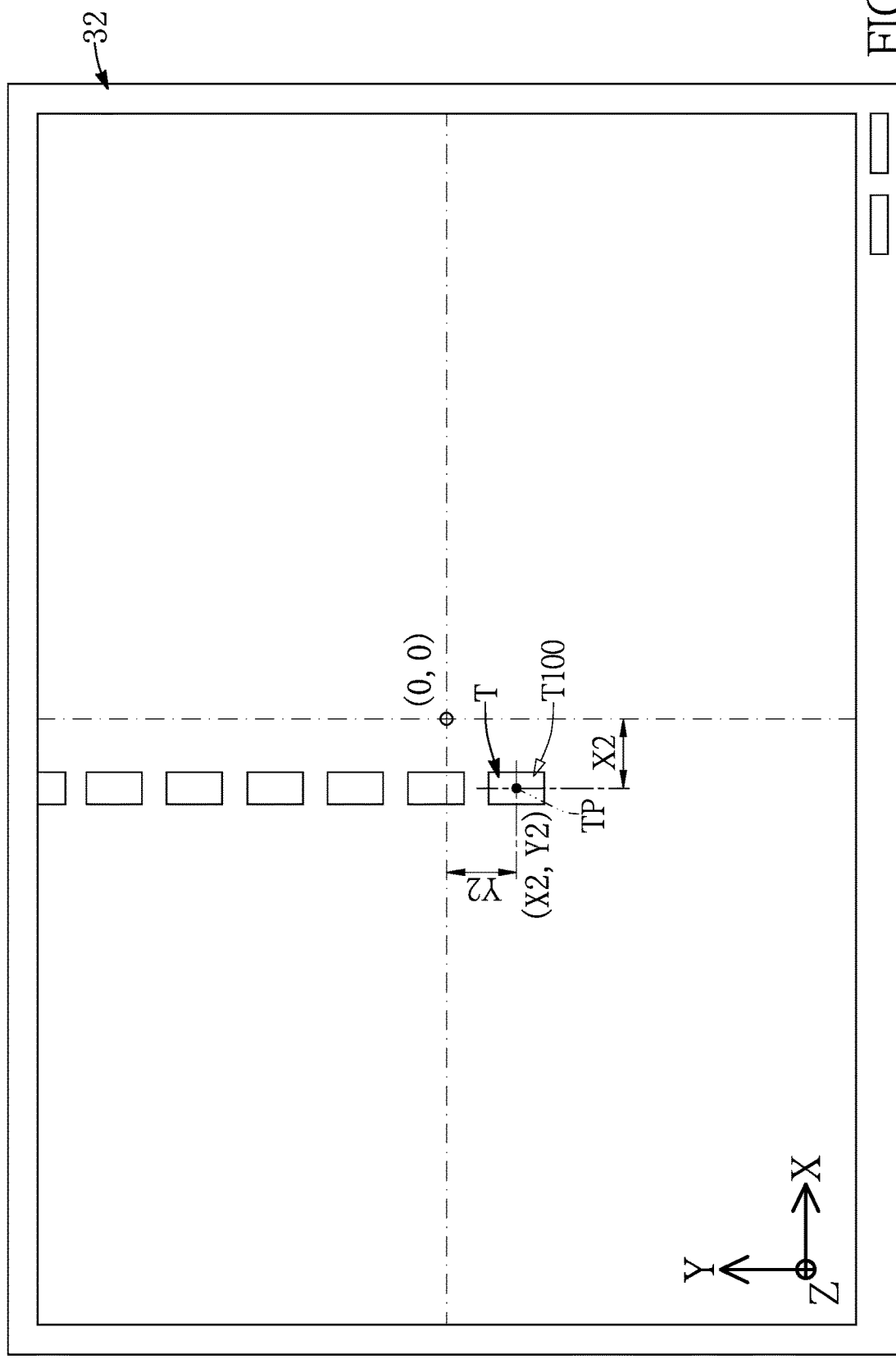
FIG. 13 is a schematic view of a plane coordinate parameter providing an X2 value and a Y2 value corresponding to the X1 value and the Y1 value of FIG. 12 according to the second embodiment of the present disclosure.

More particularly, in the second embodiment, as shown in FIG. 13, relative to the origin (0, 0) of the XY coordinate system provided by the image display device 32, the coordinate position of the target alignment reference point TP relative to the origin (0, 0) of the XY coordinate system can be an X2 value (e.g., −50 μm) and a Y2 value (e.g., −50 μm) of the XY coordinate system.

More particularly, in the second embodiment, the X3 value shown in FIG. 13 is −150 μm obtained by adding the X1 value (i.e., −100 μm) and the X2 value (i.e., −50 μm), and the Y3 value shown in FIG. 13 is −250 μm obtained by adding the Y1 value (i.e., −200 μm) and the Y2 value (i.e., −50 μm). That is to say, as shown in FIG. 13, relative to the origin (0, 0) of the XY coordinate system provided by the image display device 32, the coordinate position of the virtual alignment point VP relative to the origin (0, 0) of the XY coordinate system can be the X3 value (e.g., −150 μm) and the Y3 value (e.g., −250 μm) of the XY coordinate system. It should be noted that, as shown in FIG. 12 and FIG. 13, the distance from the target alignment reference point TP to the virtual alignment point VP (i.e., in the XY coordinate system shown in FIG. 13, the X coordinate value obtained by subtracting the X2 value from the X3 value, and the Y coordinate value obtained by subtracting the Y2 value from the Y3 value) is substantially equal to a distance from the selected fiber end portion 2000 to the selected visible reference point SP (i.e., the X1 value and the Y1 value of the XY coordinate system as shown in FIG. 12).

Third Embodiment

Comparing FIG. 14 with FIG. 5, and comparing FIG. 15 with FIG. 7, the main difference between the third embodiment and the first embodiment is as follows: in the third embodiment, the selected visual reference point SP can replace "being located at the lower right corner of the outer housing 201" with "being located at the upper right corner of the outer housing 201," and the selected fiber end portion 2000 can replace "a selected one of the fiber end portions 2000 is in a lower right corner" with "a selected one of the fiber end portions 2000 is in an upper right corner."

Figure 14:
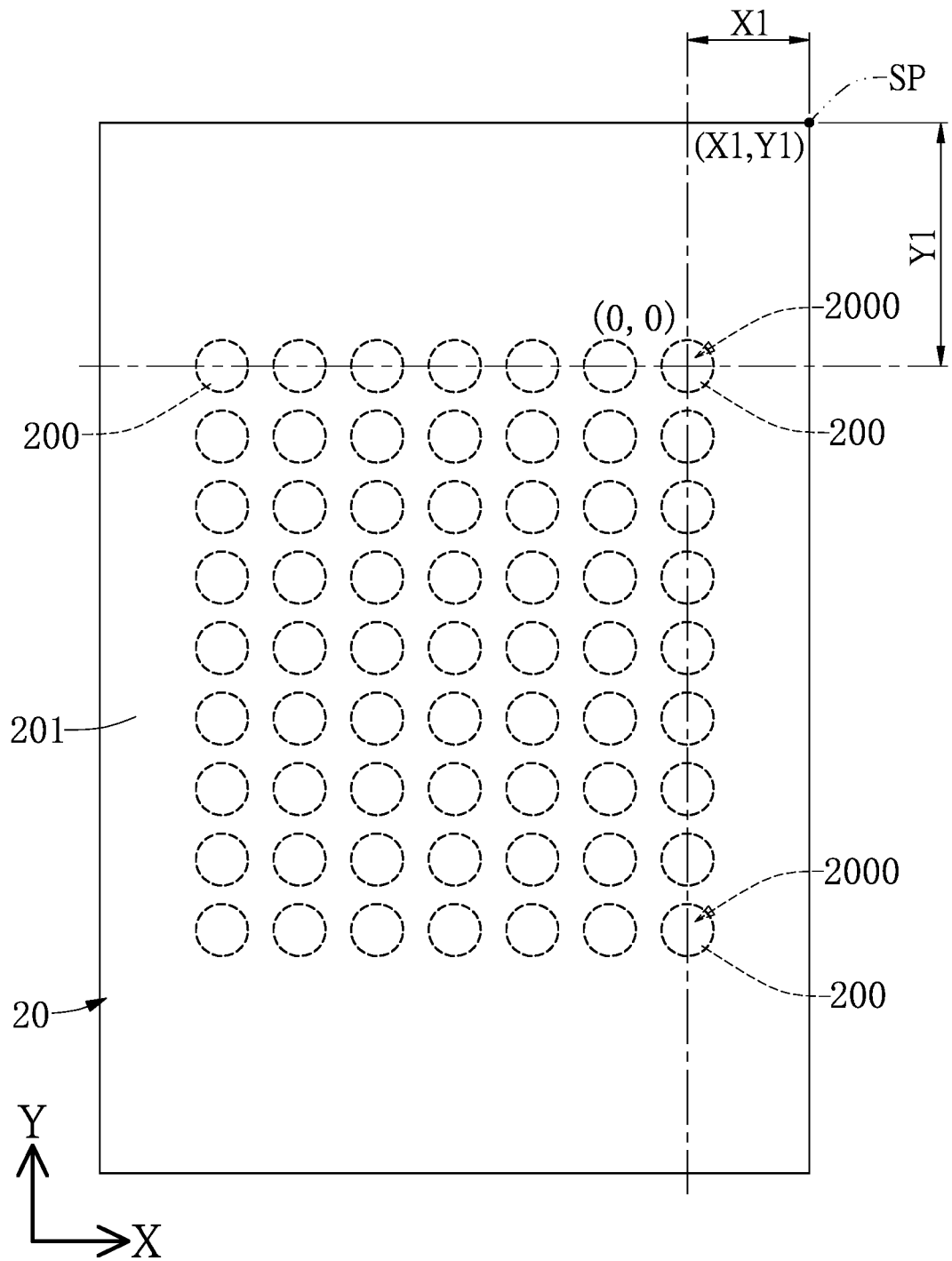
FIG. 14 is a schematic view of the actual distance parameter providing the X1 value and the Y1 value on the XY coordinate system provided by the plane (the selected visible reference point is located at an upper right corner of the outer casing, and the selected one of the fiber end portions is in the upper right corner) according to a third embodiment of the present disclosure.

More particularly, in the third embodiment, as shown in FIG. 14, when "the selected visible reference point SP is located at the upper right corner of the outer casing 201" and "a selected one of the fiber end portions 2000 is in an upper right corner (i.e., the selected fiber end portion 2000)," the selected fiber end portion 2000 can be defined as the origin (0, 0), and the coordinate position of the selected visual reference point SP relative to the selected fiber end portion 2000 can be an X1 value (e.g., 100 μm) and a Y1 value (e.g., 200 μm) of the XY coordinate system.

Figure 15:
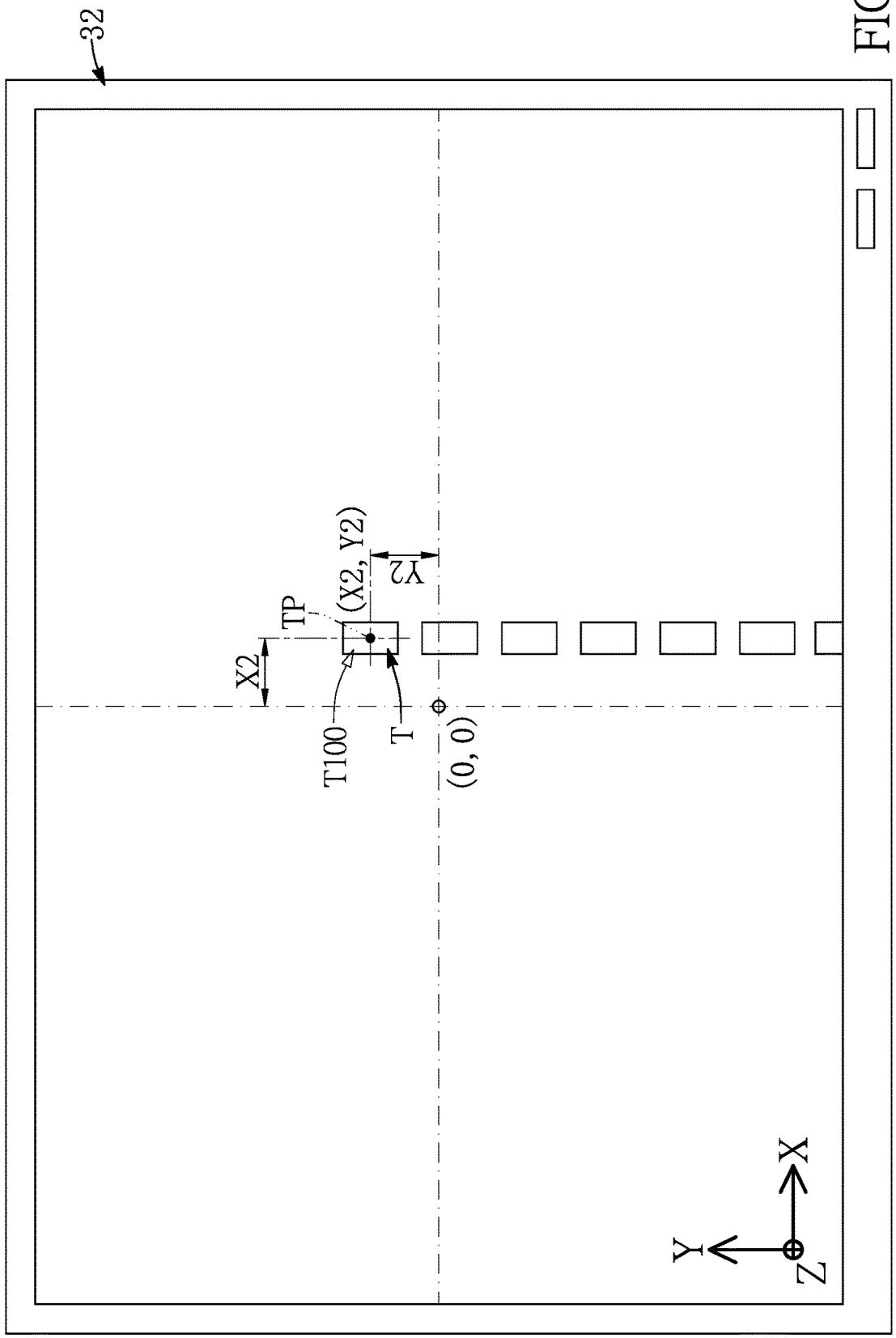
FIG. 15 is a schematic view of the plane coordinate parameter providing the X2 value and the Y2 value corresponding to the X1 value and the Y1 value of FIG. 14 according to the third embodiment of the present disclosure.

More particularly, in the third embodiment, as shown in FIG. 15, relative to the origin (0, 0) of the XY coordinate system provided by the image display device 32, the coordinate position of the target alignment reference point TP relative to the origin (0, 0) of the XY coordinate system can be an X2 value (e.g., 50 μm) and a Y2 value (e.g., 50 μm) of the XY coordinate system.

More particularly, in the third embodiment, the X3 value shown in FIG. 15 is 150 μm obtained by adding the X1 value (i.e., 100 μm) and the X2 value (i.e., 50 μm), and the Y3 value shown in FIG. 15 is 250 μm obtained by adding the Y1 value (i.e., 200 μm) and the Y2 value (i.e., 50 μm). That is to say, as shown in FIG. 15, relative to the origin (0, 0) of the XY coordinate system provided by the image display device 32, the coordinate position of the virtual alignment point VP relative to the origin (0, 0) of the XY coordinate system can be the X3 value (e.g., 150 μm) and the Y3 value (e.g., 250 μm) of the XY coordinate system. It should be noted that, as shown in FIG. 14 and FIG. 15, the distance from the target alignment reference point TP to the virtual alignment point VP (i.e., in the XY coordinate system shown in FIG. 15, the X coordinate value obtained by subtracting the X2 value from the X3 value, and the Y coordinate value obtained by subtracting the Y2 value from the Y3 value) is substantially equal to a distance from the selected fiber end portion 2000 to the selected visible reference point SP (i.e., the X1 value and the Y1 value of the XY coordinate system as shown in FIG. 14).

Fourth Embodiment

Comparing FIG. 16 with FIG. 5, and comparing FIG. 17 with FIG. 7, the main difference between the fourth embodiment and the first embodiment is as follows: in the third embodiment, the selected visual reference point SP can replace "being located at the lower right corner of the outer housing 201" with "being located at the upper left corner of the outer housing 201," and the selected fiber end portion 2000 can replace "a selected one of the fiber end portions 2000 is in a lower right corner" with "a selected one of the fiber end portions 2000 is in an upper left corner."

Figure 16:
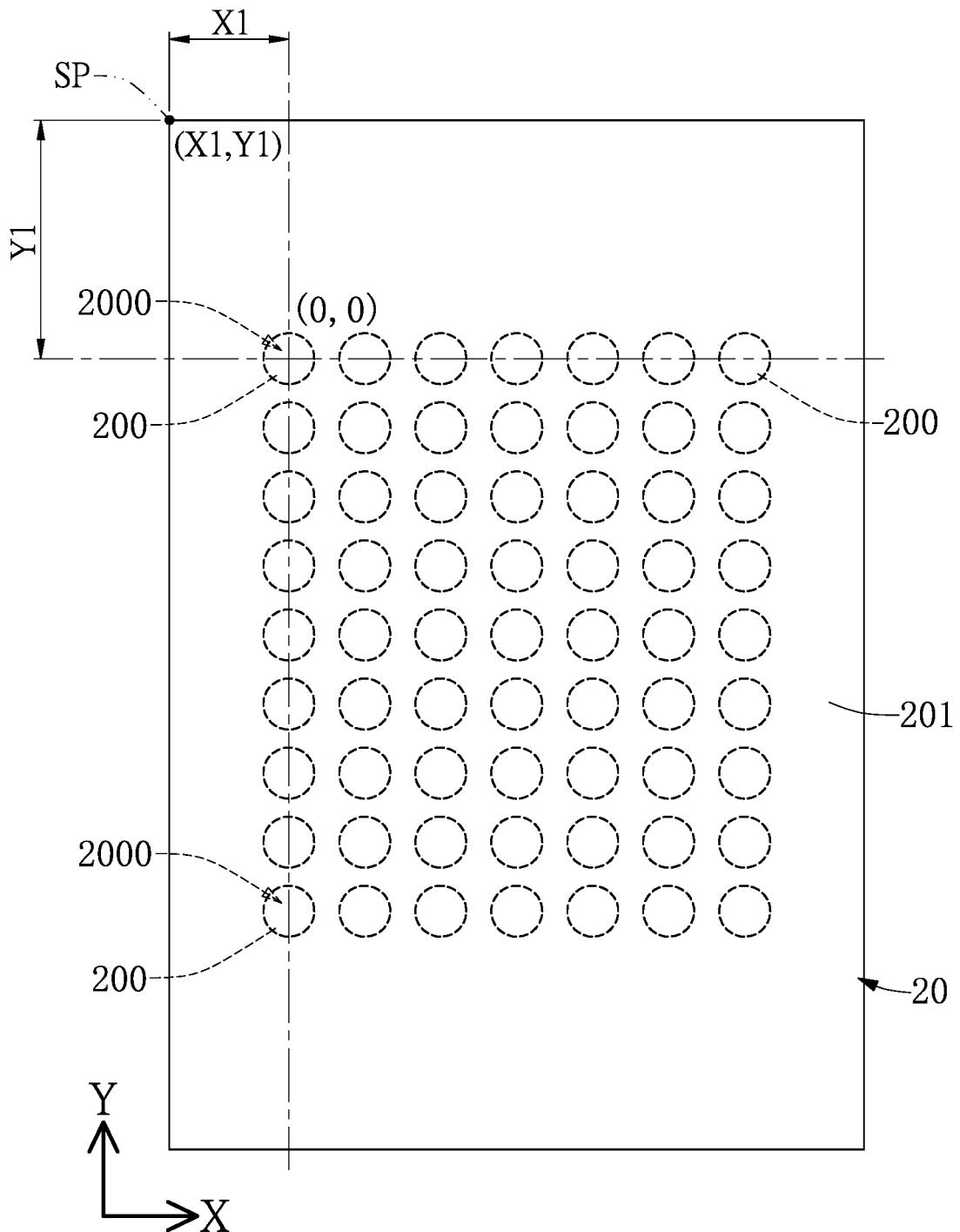
FIG. 16 is a schematic view of the actual distance parameter providing the X1 value and the Y1 value on the XY coordinate system provided by the plane (the selected visible reference point is located at an upper left corner of the outer casing, and the selected one of the fiber end portions is in the upper left corner) according to a fourth embodiment of the present disclosure.

More particularly, in the fourth embodiment, as shown in FIG. 16, when "the selected visible reference point SP is located at the upper left corner of the outer casing 201" and "a selected one of the fiber end portions 2000 is in an upper left corner (i.e., the selected fiber end portion 2000)," the selected fiber end portion 2000 can be defined as the origin (0, 0), and the coordinate position of the selected visual reference point SP relative to the selected fiber end portion 2000 can be an X1 value (e.g., −100 μm) and a Y1 value (e.g., 200 μm) of the XY coordinate system.

Figure 17:
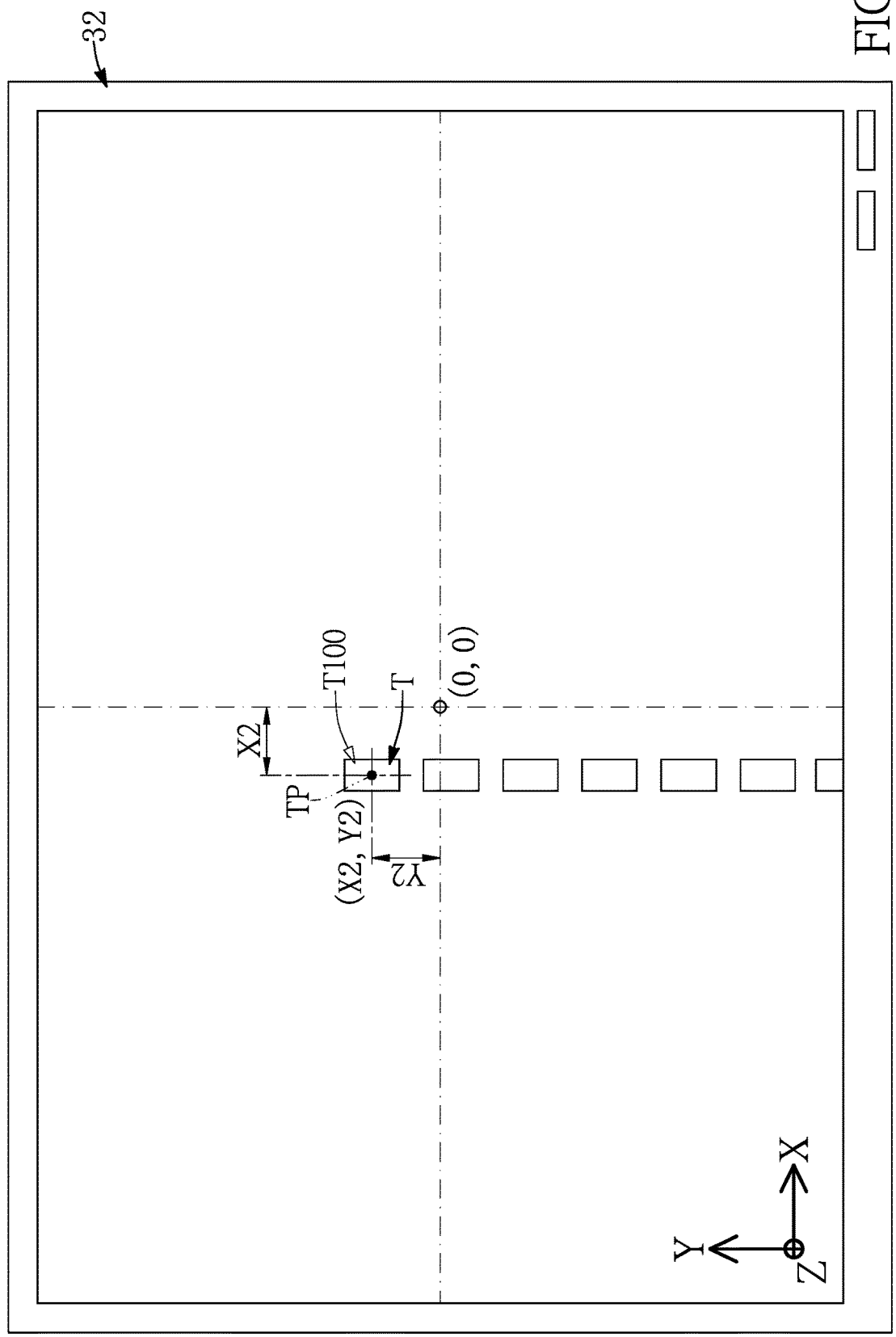
FIG. 17 is a schematic view of the plane coordinate parameter providing the X2 value and the Y2 value corresponding to the X1 value and the Y1 value of FIG. 16 according to the fourth embodiment of the present disclosure.

More particularly, in the fourth embodiment, as shown in FIG. 17, relative to the origin (0, 0) of the XY coordinate system provided by the image display device 32, the coordinate position of the target alignment reference point TP relative to the origin (0, 0) of the XY coordinate system can be an X2 value (e.g., −50 μm) and a Y2 value (e.g., 50 μm) of the XY coordinate system.

More particularly, in the fourth embodiment, the X3 value shown in FIG. 17 is −150 μm obtained by adding the X1 value (i.e., −100 μm) and the X2 value (i.e., −50 μm), and the Y3 value shown in FIG. 17 is 250 μm obtained by adding the Y1 value (i.e., 200 μm) and the Y2 value (i.e., 50 μm). That is to say, as shown in FIG. 17, relative to the origin (0, 0) of the XY coordinate system provided by the image display device 32, the coordinate position of the virtual alignment point VP relative to the origin (0, 0) of the XY coordinate system can be the X3 value (e.g., −150 μm) and the Y3 value (e.g., 250 μm) of the XY coordinate system. It should be noted that, as shown in FIG. 16 and FIG. 17, the distance from the target alignment reference point TP to the virtual alignment point VP (i.e., in the XY coordinate system shown in FIG. 17, the X coordinate value obtained by subtracting the X2 value from the X3 value, and the Y coordinate value obtained by subtracting the Y2 value from the Y3 value) is substantially equal to a distance from the selected fiber end portion 2000 to the selected visible reference point SP (i.e., the X1 value and the Y1 value of the XY coordinate system as shown in FIG. 16).

Beneficial Effects of the Embodiments

In conclusion, even if the fiber end portion 2000 is blocked so that the relative position relationship among the fiber end portion 2000 and the predetermined target object T that are displayed on the image display device 32 cannot be recognized, the user can still view the relative position relationship among the selected visible reference point SP and the virtual alignment point VP that are displayed on the image display device 32 so as to align (or coincide) the selected visible reference point SP and the virtual alignment point VP with each other on the image display device 32, so that the selected fiber end portion 2000 can be conveniently and quickly aligned with the predetermined target object T (i.e., the optical element that needs to be optically detected or tested by the optical detection) in the vertical direction.

It is worth mentioning that, as shown in FIG. 2, FIG. 3 and FIG. 9, the alignment method for the predetermined target object T provided by the first embodiment of the present disclosure further includes: firstly, moving the predetermined target object T or the image capturing device 31 to obtain an actual moving distance (e.g., 100 μm) of the predetermined target object T along a predetermined direction such as the X-axis direction (for example, picking any one of the predetermined target objects T as a reference point, and then only moving the chuck 10 (i.e., moving the predetermined target object T relative to the image capturing device 31) by a predetermined distance which can be measured and defined as the actual moving distance of the predetermined target object T by the optical detection system S, or then only moving the image capturing device 31 (i.e., moving the image capturing device 31 relative to the predetermined target object T) by a predetermined distance which can be measured and defined as the actual moving distance of the predetermined target object T by the optical detection system S); afterward, according to the actual moving distance (e.g., 100 μm) of the predetermined target object T along the predetermined direction (e.g., the X-axis direction), obtaining an image pixel distance (e.g., 10 pixel) of the real-time target object image T100 of the predetermined target object T displayed on the image display device 32 moving along the predetermined direction (e.g., the X-axis direction); and then according to the image pixel distance (e.g., 10 pixel) of the real-time target object image T100 and the actual moving distance (e.g., 100 μm) of the predetermined target object T, obtaining a conversion ratio (e.g., 10 pixel:100 μm=1:10) of the image pixel distance (e.g., 10 pixel) to the actual moving distance (e.g., 100 μm). When the predetermined target object T or the image capturing device 31 is moved so that the predetermined target object T is offset along an offset direction by an actual offset distance (e.g., 200 μm), a virtual alignment image VM displayed on the image display device 32 is automatically shifted along the offset direction by an offset pixel distance (e.g., 200/10=20 pixel) according to the conversion ratio (e.g. 1:10), so that the virtual alignment image VM and the real-time outer casing image 2010 that are displayed on the image display device 32 can be maintained in a state of overlapping with each other.

As mentioned above, the conversion ratio of the image pixel distance to the actual moving distance can be obtained according to the image pixel distance of the real-time target object image T100 and the actual moving distance of the predetermined target object T. Hence, when the predetermined target object T or the image capturing device 31 is unexpectedly moved by an actual offset distance (for example, when the user accidentally touches a chunk that is used for carrying the predetermined target object T, or touches the image capturing device 31), the virtual alignment image VM displayed on the image display device 32 can be automatically shifted along the offset direction by an offset pixel distance according to the conversion ratio, thereby the virtual alignment image VM and the real-time outer casing image 2010 that are displayed on the image display device 32 can be maintained in a mutually overlapping state, and it will not be affected by the user accidentally touching the predetermined target object T or the image capturing device 31.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An alignment method for a predetermined target object, comprising:
providing an optical probe device, wherein the optical probe device includes a plurality of optical fibers, and each of the optical fibers has a fiber end portion for receiving or outputting one or more optical signals;
providing an actual distance parameter, wherein the actual distance parameter is a plane distance on a plane between a selected one of the fiber end portions and a selected visible reference point provided by the optical probe device;
capturing the predetermined target object by an image capturing device so as to display a real-time target object image of the predetermined target object on an image display device in real time;
marking the real-time target object image of the predetermined target object on the image display device so as to obtain a target alignment reference point aligned with the real-time target object image;
transforming the target alignment reference point that is aligned with the real-time target object image into a plane coordinate parameter;
according to the actual distance parameter and the plane coordinate parameter, obtaining a virtual alignment coordinate parameter for providing a virtual alignment point, wherein a distance from the target alignment reference point to the virtual alignment point is equal to a distance from the selected fiber end portion to the selected visible reference point; and
adjusting a relative distance between the optical probe device and the predetermined target object until the selected visible reference point and the virtual alignment point coincide with each other on the image display device, so that the selected fiber end portion is aligned with the predetermined target object in a vertical direction.

2. The alignment method according to claim 1,
wherein the optical fibers of the optical probe device are arranged in sequence to form an optical fiber array for simultaneously detecting a plurality of predetermined objects to be tested, and one of the predetermined objects is the predetermined target object;
wherein the optical probe device includes an outer casing configured for carrying the fiber end portions, and the selected visible reference point is located at one of a plurality of corners of the outer casing or one of a plurality of fixed markers of the outer casing;
wherein, among all of the fiber end portions, the selected fiber end portion is closest to the selected visible reference point, so that the plane distance from the selected fiber end portion to the selected visible reference point is a shortest plane distance between the fiber end portion and the selected visible reference point;
wherein the actual distance parameter includes an X1 value and a Y1 value, the X1 value is an interval between the selected fiber end portion and the selected visible reference point on an X-axis direction provided by the plane, and the Y1 value is an interval between the selected fiber end portion and the selected visible reference point on a Y-axis direction provided by the plane;
wherein, the step of providing the actual distance parameter further includes: inputting the X1 value and the Y1 value or inputting model information of the optical probe device in a user interface, and the model information of the optical probe device contains the X1 value and the Y1 value.

3. The alignment method according to claim 1,
wherein, in the step of marking the real-time target object image of the predetermined target object on the image display device, the real-time target object image is marked by a movable marker that is controllable through an input device;
wherein, in the step of obtaining the virtual alignment coordinate parameter, the virtual alignment coordinate parameter is obtained by calculating the actual distance parameter and the plane coordinate parameter through a control module, and the virtual alignment point is selectively displayed or not displayed on the image display device;
wherein the actual distance parameter includes an X1 value and a Y1 value on an XY coordinate system provided by the plane, the X1 value is an interval between the selected fiber end portion and the selected visible reference point in an X-axis direction of the XY coordinate system provided by the plane, and the Y1 value is an interval between the selected fiber end portion and the selected visible reference point in a Y-axis direction of the XY coordinate system provided by the plane;
wherein the plane coordinate parameter includes an X2 value and a Y2 value on an XY coordinate system provided by the image display device, the X2 value is a distance from the target alignment reference point to a Y-axis of the XY coordinate system provided by the image display device, and the Y2 value is a distance from the target alignment reference point to a Y-axis of the XY coordinate system provided by the image display device;
wherein the virtual alignment coordinate parameter includes an X3 value obtained by adding the X1 value and the X2 value, and a Y3 value obtained by adding the Y1 value and the Y2 value, the X3 value and the Y3 value are on the XY coordinate system that are provided by the image display device, the X3 value is a distance from the virtual alignment point to a Y-axis of the XY coordinate system provided by the image display device, and the Y3 value is a distance from the virtual alignment point to an X-axis of the XY coordinate system provided by the image display device.

4. The alignment method according to claim 1,
wherein, after the step of obtaining the virtual alignment coordinate parameter, the alignment method further comprises: according to the target alignment reference point and the virtual alignment coordinate parameter, generating a virtual alignment image that is displayed on the image display device;
wherein, in the step of adjusting the relative distance between the optical probe device and the predetermined target object, the alignment method further comprises: capturing an outer casing of the optical probe device by the image capturing device so as to display a real-time outer casing image of the outer casing on the image display device in real time, and manually adjusting the relative distance between the outer casing and the predetermined target object until the real-time outer casing image and the virtual alignment image that are displayed on the image display device overlap with each other;
wherein at least one contour line of the real-time outer casing image corresponds to at least one contour line of the virtual alignment image;
wherein, in the step of adjusting the relative distance between the optical probe device and the predetermined target object, the alignment method further comprises: when the at least one contour line of the real-time outer casing image is offset from the at least one contour line of the virtual alignment image, manually rotating the outer casing of the optical probe device relative to a Z-axis of an XYZ coordinate system provided by the image display device until the at least one contour line of the real-time outer casing image and the at least one contour line of the virtual alignment image overlap with each other or are parallel to each other;
wherein, the optical probe device includes an outer casing configured for carrying the fiber end portions, and both an outer contour of the virtual alignment image and an outer contour of the outer casing are completely or partially the same;
wherein the virtual alignment image displayed on the image display device is translucent so as to allow a user to view the real-time outer casing image that is displayed on the image display device;
wherein, in an overlapping relationship in a Z-axis direction between the virtual alignment image, the real-time target object image and the real-time outer casing image that are displayed on the image display device, the virtual alignment image is located at an uppermost layer, the real-time target object image is located at a bottommost layer, and the real-time outer casing image is located between the virtual alignment image and the real-time target object image.

5. The alignment method according to claim 1,
wherein, after the step of obtaining the virtual alignment coordinate parameter, the alignment method further comprises: according to the target alignment reference point and the virtual alignment coordinate parameter, generating a virtual alignment image that is not displayed on the image display device;
wherein, in the step of adjusting the relative distance between the optical probe device and the predetermined target object, the alignment method further comprises: capturing an outer casing of the optical probe device by the image capturing device so as to display a real-time outer casing image of the outer casing on the image display device in real time, and automatically adjusting the relative distance between the outer casing and the predetermined target object until the real-time outer casing image and the virtual alignment image overlap with each other;
wherein at least one contour line of the real-time outer casing image corresponds to at least one contour line of the virtual alignment image that is not displayed on the image display device;
wherein, in the step of adjusting the relative distance between the optical probe device and the predetermined target object, the alignment method further comprises: when the at least one contour line of the real-time outer casing image is offset from the at least one contour line of the virtual alignment image, automatically rotating the outer casing of the optical probe device relative to a Z-axis of an XYZ coordinate system provided by the image display device until the at least one contour line of the real-time outer casing image and the at least one contour line of the virtual alignment image overlap with each other or are parallel to each other.

6. The alignment method according to claim 1,
moving the predetermined target object or the image capturing device to obtain an actual moving distance of the predetermined target object along a predetermined direction;
according to the actual moving distance of the predetermined target object along the predetermined direction, obtaining an image pixel distance of the real-time target object image of the predetermined target object displayed on the image display device moving along the predetermined direction; and
according to the image pixel distance of the real-time target object image and the actual moving distance of the predetermined target object, obtaining a conversion ratio of the image pixel distance to the actual moving distance;
wherein, when the predetermined target object or the image capturing device is moved so that the predetermined target object is offset along an offset direction by an actual offset distance, a virtual alignment image displayed on the image display device is automatically shifted along the offset direction by an offset pixel distance according to the conversion ratio, so that the virtual alignment image and the real-time outer casing image that are displayed on the image display device are maintained in a state of overlapping with each other.

7. An optical detection system, comprising:
a chuck stage including a chuck configured for carrying a plurality of predetermined objects to be tested;
an optical detection module including the optical probe device as claimed in claim 1, wherein the optical probe device is configured to be disposed above the chuck for optically detecting the predetermined object;
a vision inspection module including the image capturing device as claimed in claim 1 and the image display device as claimed in claim 1, wherein the image capturing device is configured for capturing a real-time image of the predetermined object in real time, and the image display device is configured for displaying the real-time image of the predetermined object in real time; and a control module is configured to electrically connect to the chuck, the optical probe device, the image capturing device and the image display device, for controlling the chuck, the optical probe device, the image capturing device and the image display device;

wherein, the control module is configured to execute the alignment method as claimed in claim 1.

8. The optical detection system according to claim 7, wherein each of the optical fibers has a fiber end portion for receiving or outputting one or more optical signals;

wherein the optical fibers of the optical probe device are arranged in sequence to form an optical fiber array for simultaneously detecting the predetermined object;

wherein the optical probe device includes an outer casing configured for carrying the fiber end portions, and a selected visible reference point provided by the optical probe device is located at one of a plurality of corners of the outer casing or one of a plurality of fixed markers of the outer casing;

wherein, among all of the fiber end portions, a selected one of the fiber end portions is closest to the selected visible reference point, so that a plane distance from the selected fiber end portion to the selected visible reference point is a shortest plane distance between the fiber end portion and the selected visible reference point.

9. An optical detection system, comprising:

a chuck stage including a chuck configured for carrying a plurality of predetermined objects to be tested;

an optical detection module including an optical probe device disposed above the chuck for optically detecting the predetermined object;

a vision inspection module including an image capturing device disposed above the chuck, and an image display device electrically connected to the image capturing device, wherein the image capturing device is configured for capturing a real-time image of the predetermined object in real time, and the image display device is configured for displaying the real-time image of the predetermined object in real time; and a control module is configured to electrically connect to the chuck, the optical probe device, the image capturing device and the image display device, for controlling the chuck, the optical probe device, the image capturing device and the image display device;

wherein the optical probe device includes a plurality of optical fibers and an outer casing configured for carrying the optical fibers, and each of the optical fibers has a fiber end portion for receiving or outputting one or more optical signals;

wherein the outer casing of the optical probe device has a selected visible reference point disposed thereon for corresponding to a selected one of the fiber end portions, and the selected visible reference point of the outer casing is configured to be able to be identified by the image capturing device;

wherein the selected visible reference point selected from the outer casing of the optical probe device is configured to determine a plane distance from the selected fiber end portion to one of the predetermined objects.

10. The optical detection system according to claim 9, wherein the optical fibers of the optical probe device are arranged in sequence to form an optical fiber array for simultaneously detecting a plurality of predetermined objects to be tested;

wherein the optical probe device includes an outer casing configured for carrying the fiber end portions, and the selected visible reference point is located at one of a plurality of corners of the outer casing or one of a plurality of fixed markers of the outer casing;

wherein, among all of the fiber end portions, the selected fiber end portion is closest to the selected visible reference point, so that the plane distance from the selected fiber end portion to the selected visible reference point is a shortest plane distance between the fiber end portion and the selected visible reference point.

* * * * *